US012805085B2

(12) United States Patent
Kang et al.

(10) Patent No.: US 12,805,085 B2
(45) Date of Patent: Nov. 17, 2026

(54) DISPLAY APPARATUS HAVING A METAL BANK LAYER HAVING A PIXEL HOLE AND A FIRST BANK HOLE

(71) Applicant: Samsung Display Co., Ltd., Yongin-Si (KR)

(72) Inventors: Jangmi Kang, Yongin-si (KR); Byungchang Yu, Yongin-si (KR); Donghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 529 days.

(21) Appl. No.: 18/195,082

(22) Filed: May 9, 2023

(65) Prior Publication Data

US 2024/0113267 A1 Apr. 4, 2024

(30) Foreign Application Priority Data

Sep. 30, 2022 (KR) ........................ 10-2022-0125796

(51) Int. Cl.
*H10H 20/857* (2025.01)

(52) U.S. Cl.
CPC ................................ *H10H 20/857* (2025.01)

(58) Field of Classification Search
CPC ............. H10H 20/857; H10K 59/1315; H10K 59/122; H10K 59/1201; H10K 59/121; H10K 59/123; H10K 59/1213; H10K 59/124; H10K 59/131; H10K 50/82; G09G 3/3233; G09G 2300/0819; G09G 2300/0852; G09G 2300/0861; G09G 2310/0251; H01L 25/0753; H01L 25/167; H10W 90/00
See application file for complete search history.

(56) References Cited

U.S. PATENT DOCUMENTS

| | | | | |
|---|---|---|---|---|
| 8,487,301 | B2 | 7/2013 | Choi et al. | |
| 11,522,034 | B2 | 12/2022 | Woo et al. | |
| 2008/0197778 | A1 * | 8/2008 | Kubota ................ | H10K 59/131 315/73 |
| 2013/0069853 | A1 | 3/2013 | Choi | |
| 2021/0083013 | A1 | 3/2021 | Bang et al. | |
| 2021/0202905 | A1 * | 7/2021 | Lee .................... | H10K 59/1315 |
| 2022/0115488 | A1 | 4/2022 | Shin et al. | |

FOREIGN PATENT DOCUMENTS

| | | | |
|---|---|---|---|
| KR | 10-2012-0004783 | A | 1/2012 |
| KR | 10-2013-0031101 | A | 3/2013 |
| KR | 10-1891242 | B1 | 8/2018 |
| KR | 10-2021-0008975 | A | 1/2021 |
| KR | 10-2021-0032608 | A | 3/2021 |
| KR | 10-2022-0047444 | A | 4/2022 |

* cited by examiner

*Primary Examiner* — Tan N Tran
(74) *Attorney, Agent, or Firm* — Innovation Counsel LLP

(57) ABSTRACT

Provided is a display apparatus including a substrate including a display area and a non-display area outside the display area, a pixel electrode on the display area, a first common voltage supply line on the non-display area and having a first hole, and a metal bank layer on the pixel electrode and the first common voltage supply line and having a pixel opening overlapping the pixel electrode and a first bank hole overlapping the first hole.

20 Claims, 19 Drawing Sheets

DISPLAY APPARATUS HAVING A METAL BANK LAYER HAVING A PIXEL HOLE AND A FIRST BANK HOLE

CROSS-REFERENCE TO RELATED APPLICATION

This application is based on and claims priority under 35 U.S.C. § 119 to Korean Patent Application No. 10-2022-0125796, filed on Sep. 30, 2022, in the Korean Intellectual Property Office, the disclosure of which is incorporated by reference herein in its entirety.

BACKGROUND

1. Field

One or more embodiments relate to a display apparatus.

2. Description of the Related Art

Recently, the usage of display apparatuses has diversified. Moreover, display apparatuses have become thinner and lighter, and thus, the usage thereof has expanded.

Generally, in the display apparatuses, thin-film transistors configured to control brightness, etc. of a light-emitting diode may be arranged in a display area. The thin-film transistors may be configured to control a light-emitting diode corresponding thereto to emit a predetermined color of light by using a data signal, a driving voltage, and a common voltage transmitted.

To provide the data signal, the driving voltage, the common voltage, etc., a data driving circuit, a driving voltage supply line, a common voltage supply line, etc. may be arranged in a non-display area outside the display area.

SUMMARY

In the related art, pixels adjacent to the non-display area may be deformed, due to gas generated in an organic layer during a manufacturing process. One or more embodiments include a display apparatus including a structure for discharging the gas generated in the organic layer during the manufacturing process, to solve various problems including the problem described above. However, this feature is an example and does not limit the scope of the disclosure.

Additional aspects will be set forth in part in the description which follows and, in part, will be apparent from the description, or may be learned by practice of the presented embodiments of the disclosure.

According to one or more embodiments, a display apparatus includes a substrate, a pixel electrode, a first common voltage supply line, and a metal bank layer. The substrate includes a display area and a non-display area outside the display area. The pixel electrode is on the display area. The first common voltage supply line is on the non-display area and has a first hole. The metal bank layer is on the pixel electrode and the first common voltage supply line and has a pixel opening overlapping the pixel electrode and a first bank hole overlapping the first hole.

The metal bank layer may cover an edge of the pixel electrode.

The display apparatus may further include a first inorganic pattern between the metal bank layer and the first common voltage supply line and covering an edge of the first hole.

The display apparatus may further include a sacrificial pattern between the first inorganic pattern and the first common voltage supply line and covering an edge of the first hole.

The display apparatus may further include an inorganic bank layer between the metal bank layer and the pixel electrode and covering an edge of the pixel electrode, wherein the first inorganic pattern may include a same material as the inorganic bank layer.

The display apparatus may further include a residual sacrificial layer between the inorganic bank layer and the pixel electrode, wherein the sacrificial pattern may include a same material as the residual sacrificial layer.

A boundary of the first hole may be at an outer portion of a boundary of the first bank hole.

A boundary of the first hole may correspond to a boundary of the first bank hole.

The display apparatus may further include a dummy bank overlapping the first hole and apart from the first common voltage supply line, wherein a boundary of the first hole may be at an inner portion of a boundary of the first bank hole.

The display apparatus may further include a sacrificial pattern between the metal bank layer and the first common voltage supply line and covering an edge of the first hole.

The metal bank layer may include a first metal layer and a second metal layer on the first metal layer, and the second metal layer may have a tip extending from an upper surface of the first metal layer toward a center of the pixel opening.

The display apparatus may further include an intermediate layer on the pixel electrode through the pixel opening of the metal bank layer and an opposite electrode on the intermediate layer through the pixel opening of the metal bank layer, wherein the opposite electrode may directly contact a side wall of the metal bank layer having the pixel opening.

The display apparatus may further include a second common voltage supply line below the first common voltage supply line and having a second hole, wherein the second hole may be to be apart from the first hole.

According to one or more embodiments, a display apparatus includes a substrate, a pixel electrode, a first common voltage supply line, a second common voltage supply line, and a metal bank layer. The substrate includes a display area and a non-display area outside the display area. The pixel electrode is on the display area. The first common voltage supply line is on the non-display area and has a first hole. The second common voltage supply line is between the substrate and the first common voltage supply line and has a second hole. The metal bank layer is on the pixel electrode and the first common voltage supply line and has a pixel opening overlapping the pixel electrode, a first bank hole overlapping the first hole, and a second bank hole overlapping the second hole.

The substrate may include a first area overlapping the first common voltage supply line and a second area outside the first area, and the first bank hole may be in the first area, and the second bank hole may be in the second area.

The display apparatus may further include an organic insulating layer between the first common voltage supply line and the second common voltage supply line and extending from the display area to the second area.

The organic insulating layer may cover an edge of the second hole.

The organic insulating layer may have a third hole overlapping the second hole, and a boundary of the third hole may correspond to a boundary of the second bank hole.

The display apparatus may further include a second inorganic pattern between the metal bank layer and the organic insulating layer and covering an edge of the second hole.

The substrate may include a third area outside the second area, and the second common voltage supply line and the metal bank layer may directly contact each other in the third area.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
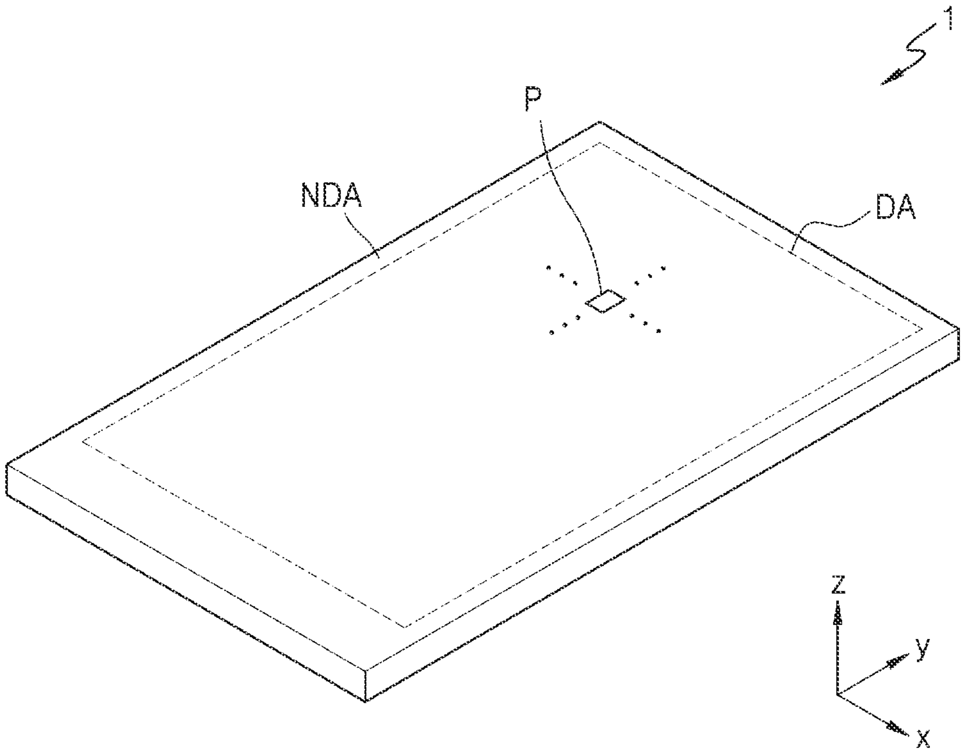
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

In this specification, the expression "A and/or B" may indicate A, B, or A and B. Also, the expression "at least one of A and B" may indicate A, B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

FIG. 1 is a schematic perspective view of a display apparatus 1 according to an embodiment.

Referring to FIG. 1, the display apparatus 1 may include a display area DA and a non-display area NDA outside the display area DA. The display area DA may display an image through pixels P arranged in the display area DA. The non-display area NDA may be arranged outside the display area DA and may not display an image. The non-display area NDA may entirely surround the display area DA. In the non-display area NDA, a driver, etc. for providing an electrical signal or power to the display area DA may be arranged. In the non-display area NDA, a pad, in which an electronic element, a printed circuit board, etc. may be electrically connected, may be arranged.

According to an embodiment, FIG. 1 illustrates that the display area DA has a polygonal shape, for example, a rectangular shape, having a length in an x direction that is less than a length in a y direction. However, in an embodiment, the display area DA may have various shapes, such as a shape of an Nth figure, where N is a natural number greater than or equal to 3, a circular shape, or an oval shape. FIG. 1 illustrates that the display area DA includes a corner portion including a vertex at which straight lines meet each other. However, in an embodiment, the display area DA may have a polygonal shape including a round corner portion.

Hereinafter, for convenience of explanation, a case in which the display apparatus 1 is an electronic device that is a smartphone is described. However, the display apparatus 1 according to an embodiment may include various products, such as a television, a notebook computer, a monitor, an advertising board, an Internet of things (IOT) device, etc., as well as portable electronic devices, such as a mobile phone, a smartphone, a tablet personal computer (PC), a mobile communication terminal, an electronic notebook, an electronic book, a portable multimedia player (PMP), a navigation device, an ultra mobile PC (UMPC), etc. Also, the display apparatus 1 according to an embodiment may be used in wearable devices, such as a smart watch, a watch phone, a glasses-type display, and a head-mounted display (HMD). Also, the display apparatus 1 according to an embodiment may be used as: a center information display (CID) on a gauge of a vehicle or a center fascia or a dashboard of the vehicle; a room mirror display substituting for a side-view mirror of a vehicle; or a display screen disposed on a rear surface of a front seat, as an entertainment device for a backseat of a vehicle.

Figure 2:
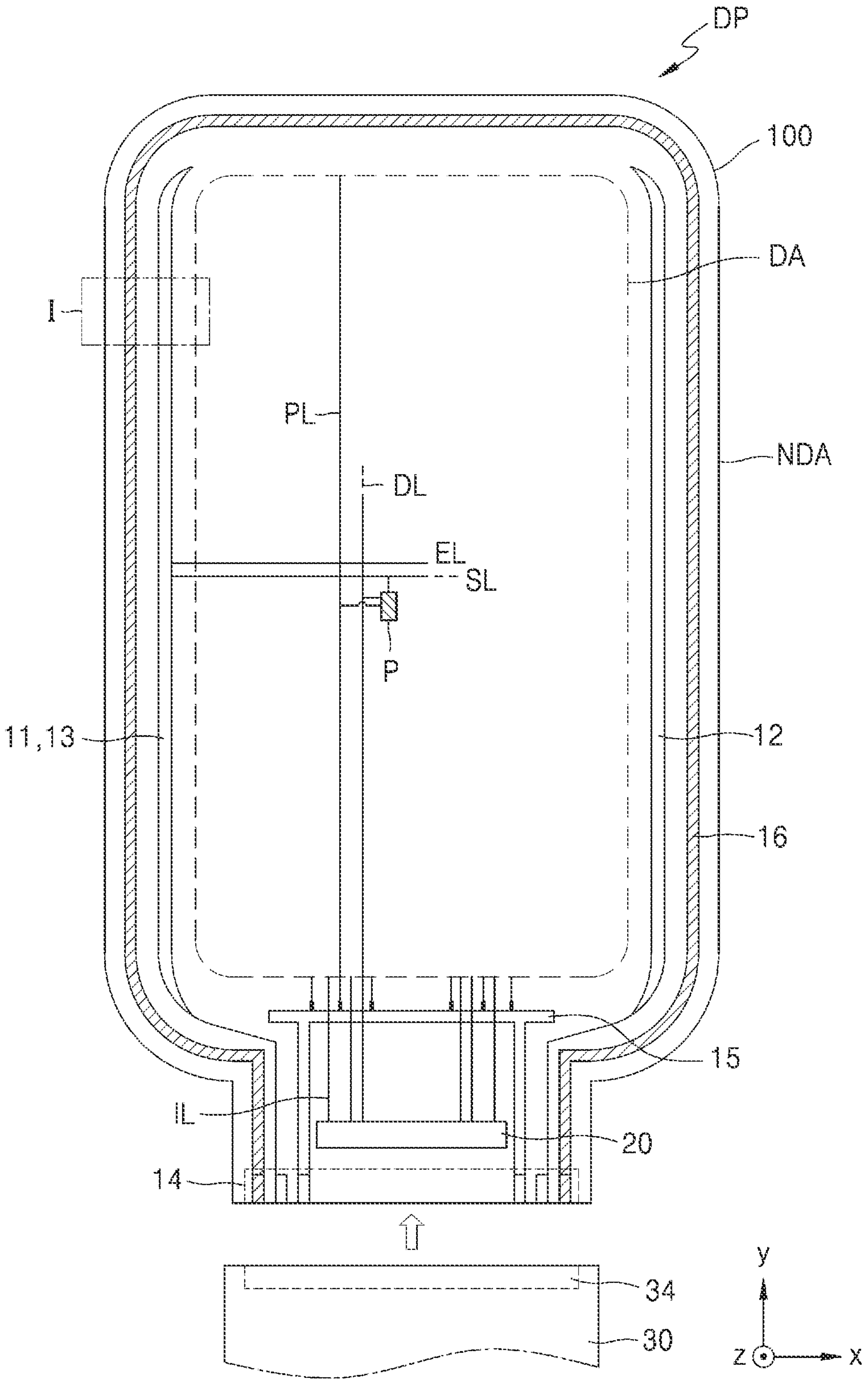
FIG. 2 is a schematic plan view of a display panel included in a display apparatus according to an embodiment.

FIG. 2 is a schematic plan view of a display panel DP included in a display apparatus according to an embodiment.

Referring to FIG. 2, the display panel DP may include the display area DA and the non-display area NDA outside the display area DA. The display area DA is configured to display an image, and the plurality of pixels P may be arranged in the display area DA. FIG. 2 illustrates that the display area DA has an approximately rectangular shape having a round corner. However, the disclosure is not limited thereto. As described above, the display area DA may have various shapes, such as a shape of an Nth figure, where N is a natural number greater than or equal to 3, a circular shape, or an oval shape.

Each of the pixels P may denote a sub-pixel and may include a display element such as an organic light-emitting diode. The pixel P may emit, for example, red, green, blue, or white light.

The non-display area NDA may be arranged outside the display area DA. External circuits configured to drive the pixel P may be arranged in the non-display area NDA. For example, a first scan driving circuit 11, a second scan driving circuit 12, an emission control driving circuit 13, a terminal 14, a driving power supply line 15, and a common power supply line 16 may be arranged in the non-display area NDA.

The first scan driving circuit 11 may be configured to provide a scan signal to the pixel P through a scan line SL. The second scan driving circuit 12 may be arranged in parallel with the first scan driving circuit 11 with the display area DA therebetween. Some of the pixels P arranged in the display area DA may be electrically connected to the first scan driving circuit 11, and the other pixels P may be electrically connected to the second scan driving circuit 12. According to necessity, the second scan driving circuit 12 may be omitted, and all of the pixels P arranged in the display area DA may be electrically connected to the first scan driving circuit 11.

The emission control driving circuit 13 may be arranged at a side of the first scan driving circuit 11 and may be configured to provide an emission control signal to the pixels P through an emission control line EL. FIG. 1 illustrates that the emission control driving circuit 13 is arranged only at a side of the display area DA. However, the emission control driving circuit 13 may be arranged at both sides of the display area DA, like the first and second scan driving circuits 11 and 12.

A driving chip 20 may be arranged in the non-display area NDA. The driving chip 20 may include an integrated circuit configured to drive the display panel DP. The integrated circuit may include a data driving integrated circuit configured to generate a data signal.

The terminal 14 may be arranged in the non-display area NDA. The terminal 14 may not be covered by an insulating layer and may be exposed to be electrically connected to a printed circuit board 30. A terminal 34 of the printed circuit board 30 may be electrically connected to the terminal 14 of the display panel DP.

The printed circuit board 30 may be configured to transmit a signal or power of a controller (not shown) to the display panel DP. A control signal generated by the controller may be transmitted to each of the driving circuits through the printed circuit board 30. Also, the controller may be configured to transmit a driving voltage ELVDD to the driving power supply line 15 and a common voltage ELVSS to the common power supply line 16. The driving voltage ELVDD may be transmitted to each pixel P through a driving voltage line PL connected to the driving power supply line 15, and the common voltage ELVSS may be transmitted to an opposite electrode of the pixel P through a metal bank layer 320, e.g., see FIG. 5, connected to the common power supply line 16. The driving power supply line 15 may have a shape extending in a direction, e.g., an x direction, and be below the display area DA. The common power supply line 16 may have a loop shape having an open side to partially surround the display area DA.

The controller may be configured to generate a data signal, and the generated data signal may be transmitted to an input line IL through the driving chip 20 and to the pixel P through a data line DL connected to the input line IL. For reference, a "line" may denote an "interconnect." This aspect is likewise applied to embodiments described below and their modified embodiments.

Figure 3A:
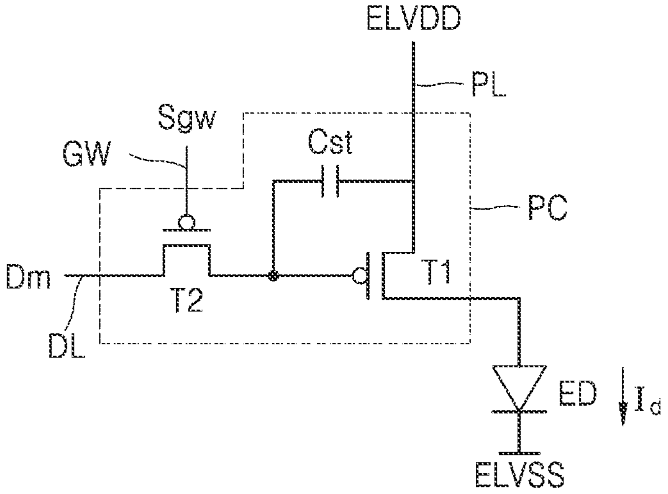
FIGS. 3A and 3B are schematic equivalent circuit diagrams of a pixel included in a display apparatus according to an embodiment.
Figure 3B:
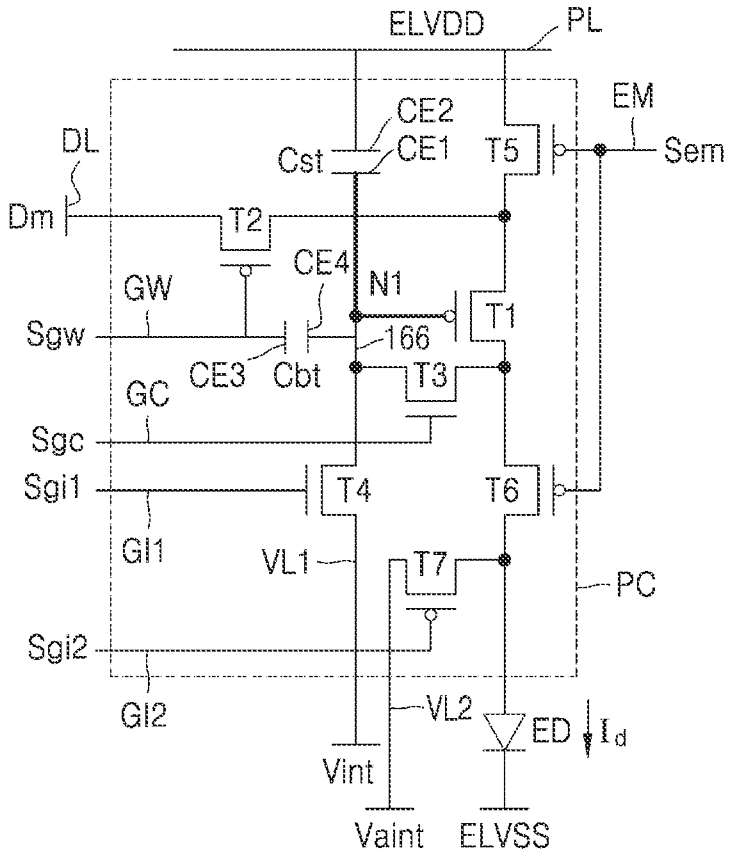

FIGS. 3A and 3B are schematic equivalent circuit diagrams of a pixel included in a display apparatus according to an embodiment.

Referring to FIG. 3A, a light-emitting diode ED may be electrically connected to a pixel circuit PC. The pixel circuit PC may include a first transistor T1, a second transistor T2, and a storage capacitor Cst.

In response to a scan signal Sgw that is input through a scan line GW, the second transistor T2 may be configured to transmit a data signal Dm that is input through a data line DL to the first transistor T1.

The storage capacitor Cst may be connected to the second transistor T2 and a driving voltage line PL and may be configured to store a voltage corresponding to a difference between a voltage received from the second transistor T2 and a driving voltage ELVDD supplied to the driving voltage line PL.

The first transistor T1 may be connected to the driving voltage line PL and the storage capacitor Cst and may be configured to control a driving current Id flowing from the driving voltage line PL through the light-emitting element ED in correspondence with a value of the voltage stored in the storage capacitor Cst. An opposite electrode, for example, a cathode, of the light-emitting diode ED may be configured to receive a common voltage ELVSS. The light-emitting diode ED may be configured to emit light having a predetermined brightness according to the driving current Id.

It is described with reference to FIG. 3A that the pixel circuit PC includes two transistors and one storage capacitor. However, referring to FIG. 3B, the pixel circuit PC may include seven transistors and two capacitors in an embodiment.

The pixel circuit PC may include first to seventh transistors T1, T2, T3, T4, T5, T6, and T7, a storage capacitor Cst, and a boost capacitor Cbt. According to an embodiment, the pixel circuit PC may not include the boost capacitor Cbt.

Some of the first to seventh transistors T1 to T7 may be n-channel metal-oxide semiconductor field effect transistors (n-channel MOSFET) (NMOS transistors), and the others may be p-channel metal-oxide semiconductor field-effect transistors (p-channel MOSFET) (PMOS transistors). According to an embodiment, the third, fourth, and seventh transistors T3, T4, and T7 may be NMOS transistors, and the other transistors T1, T2, T5, T6 may be PMOS transistors.

The first to seventh transistors T1 to T7, the storage capacitor Cst, and the boost capacitor Cbt may be connected to signal lines. The signal lines may include a scan line GW, an emission control line EM, a compensation gate line GC, a first initialization gate line GI1, a second initialization gate line GI2, and a data line DL. The pixel circuit PC may be electrically connected to a voltage line, for example, a driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a pixel electrode, e.g., an anode, of the emitting-diode ED through the sixth transistor T6. One of the first and second electrodes of the first transistor T1 may be a source electrode, and the other may be a drain electrode. The first transistor T1 may be configured to supply a driving current Id to the light-emitting diode ED according to a switching operation of the second transistor T2.

The second transistor T2 may be a switching transistor. A second gate electrode of the second transistor T2 may be connected to the scan line GW, a first electrode of the second transistor T2 may be connected to the data line DL, and a second electrode of the second transistor T2 may be connected to the first electrode of the first transistor T1 and may be electrically connected to the driving voltage line PL through the fifth transistor T5. One of the first and second electrodes of the second transistor T2 may be a source electrode, and the other may be a drain electrode. The second transistor T2 may be turned on in response to a scan signal Sgw transmitted through the scan line GW and may be configured to perform a switching operation of transmitting a data signal Dm transmitted through the data line DL to the first electrode of the first transistor T1.

The third transistor T3 may be a compensation transistor configured to compensate for a threshold voltage of the first transistor T1. A third gate electrode of the third transistor T3 may be connected to the compensation gate line GC. A first electrode of the third transistor T3 may be connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 may be connected to the second electrode of the first transistor T1 and may be electrically connected to a pixel electrode, e.g., an anode, of the light-emitting diode ED through the sixth transistor T6. One of the first and second electrodes of the third transistor T3 may be a source electrode, and the other may be a drain electrode.

The third transistor T3 may be turned on in response to a compensation signal Sgc transmitted through the compensation gate line GC and may be configured to electrically connect the first gate electrode and the second electrode, e.g., the drain electrode, of the first transistor T1 to each other to diode-connect the first transistor T1.

The fourth transistor T4 may be a first initialization transistor configured to initialize the first gate electrode of the first transistor T1. A fourth gate electrode of the fourth transistor T4 may be connected to the first initialization gate line GI1. A first electrode of the fourth transistor T4 may be connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first and second electrodes of the fourth transistor T4 may be a source electrode, and the other may be a drain electrode. The fourth transistor T4 may be turned on in response to a first initialization signal Sgi1 received through the first initialization gate line GI1 and may be configured to perform an initialization operation of initializing a voltage of the first gate electrode of the first transistor T1 by transmitting a first initialization voltage Vint to the first gate electrode of the first transistor T1.

The fifth transistor T5 may be an operation control transistor. A fifth gate electrode of the fifth transistor T5 may be connected to the emission control line EM, a first electrode of the fifth transistor T5 may be connected to the driving voltage line PL, and a second electrode of the fifth transistor T5 may be connected to the first electrode of the first transistor T1 and the second electrode of the second transistor T2. One of the first and second electrodes of the fifth transistor T5 may be a source electrode, and the other may be a drain electrode.

The sixth transistor T6 may be an emission control transistor. A sixth gate electrode of the sixth transistor T6 may be connected to the emission control line EM, a first electrode of the sixth transistor T6 may be connected to the second electrode of the first transistor T1 and the second electrode of the third transistor T3, and a second electrode of the sixth transistor T6 may be electrically connected to a second electrode of the seventh transistor T7 and the pixel electrode, e.g., the anode, of the light-emitting diode ED. One of the first and second electrodes of the sixth transistor T6 may be a source electrode, and the other may be a drain electrode.

The fifth transistor T5 and the sixth transistor T6 may be simultaneously turned on in response to an emission control signal Sem received through the emission control line EL so that the driving voltage ELVDD may be transmitted to the light-emitting diode ED, and the driving current Id may flow through the light-emitting diode ED.

The seventh transistor T7 may be a second initialization transistor configured to initialize the pixel electrode, e.g., the anode, of the light-emitting diode ED. A seventh gate electrode of the seventh transistor T7 may be connected to the second initialization gate line GI2. A first electrode of the seventh transistor T7 may be connected to the second initialization voltage line VL2. The second electrode of the seventh transistor T7 may be connected to the second electrode of the sixth transistor T6 and the pixel electrode, e.g., the anode, of the light-emitting diode ED. The seventh transistor T7 may be turned on in response to a second initialization signal Sgi2 transmitted through the second initialization gate line GI2 and may be configured to transmit a second initialization voltage Vaint to the pixel electrode, e.g., the anode, of the light-emitting diode ED to initialize the pixel electrode of the light-emitting diode ED.

According to some embodiments, the second initialization gate line GI2 may be a next scan line. For example, the second initialization gate line GI2 connected to the seventh transistor T7 of the pixel circuit PC arranged in an ith row, where i is a natural number, may correspond to a scan line of the pixel circuit PC arranged in an i+1th row. According to an embodiment, the second initialization gate line GI2 may be the emission control line EM. For example, the emission control line EM may be electrically connected to the fifth to seventh transistors T5 to T7.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line PL. The storage capacitor Cst may be configured to store a charge corresponding to a difference between a voltage of the first gate electrode of the first transistor T1 and the driving voltage ELVDD.

The boost capacitor Cbt may include a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166.

When the scan signal Sgw supplied through the scan line GW is turned off, the boost capacitor Cbt may increase a voltage of a first node N1, and when the voltage of the first node N1 is increased, a black gradation may be vividly displayed.

The first node N1 may be an area in which the first gate electrode of the first transistor T1, the first electrode of the third transistor T3, the second electrode of the fourth transistor T4, and the fourth electrode CE4 of the boost capacitor Cbt are connected to each other.

According to an embodiment, with reference to FIG. 3B, it is described that the third and fourth transistors T3 and T4 are NMOS transistors, and the first, second, and fifth to seventh transistors T1, T2, T5 to T7 are PMOS transistors. The first transistor T1, which may directly affect the brightness of a display apparatus, may be provided to include a semiconductor layer including polycrystalline silicon having a high reliability, and thus, the display apparatus having a high resolution may be realized.

Figure 4:
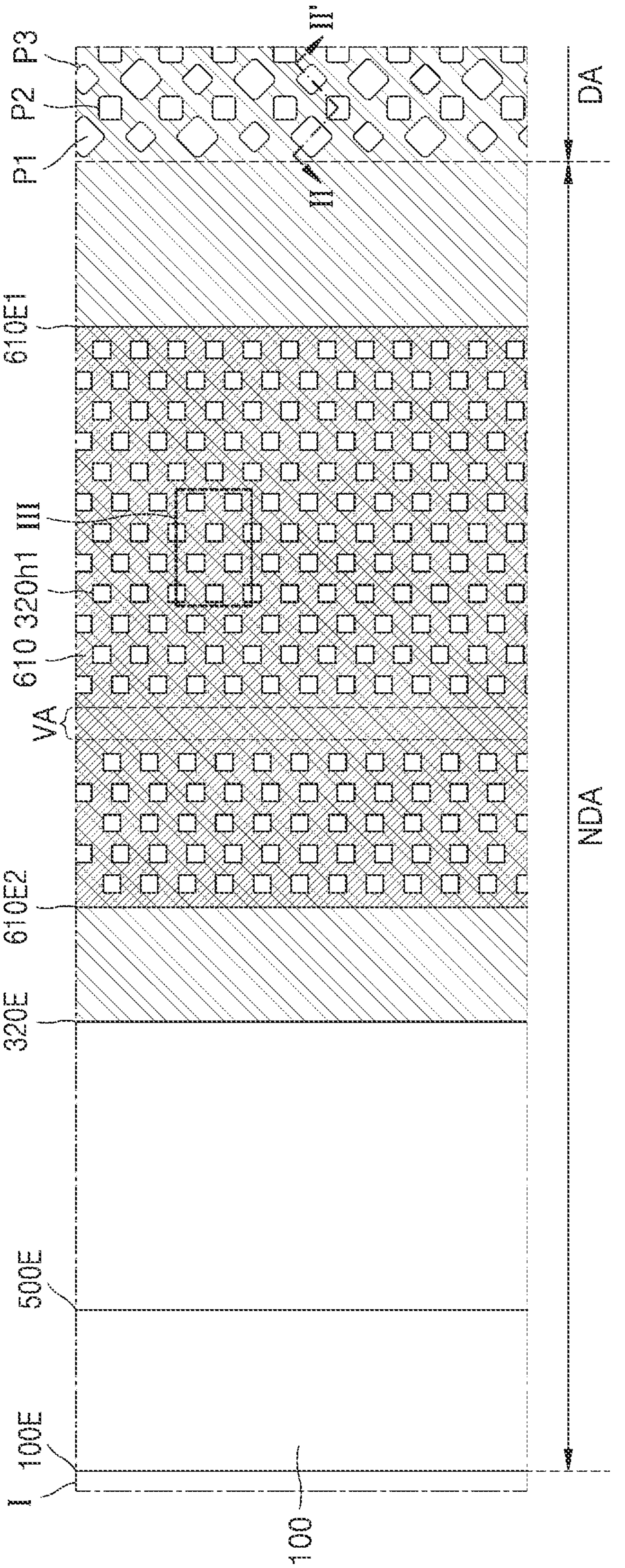
FIG. 4 is a schematic plan view of a portion of a display apparatus according to an embodiment.
Figure 5:
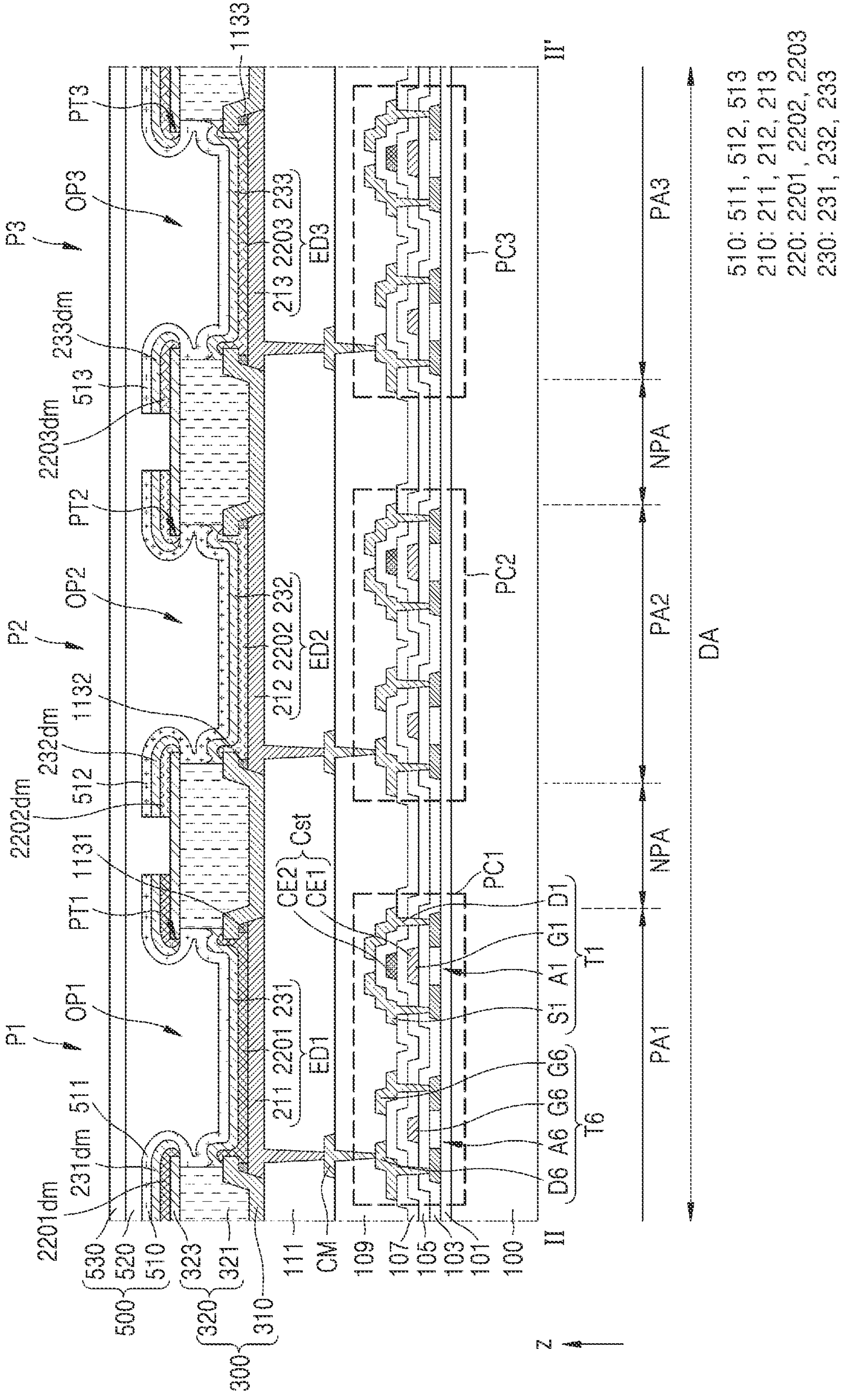
FIG. 5 is a schematic cross-sectional view of a portion of a display apparatus according to an embodiment.
Figure 6:
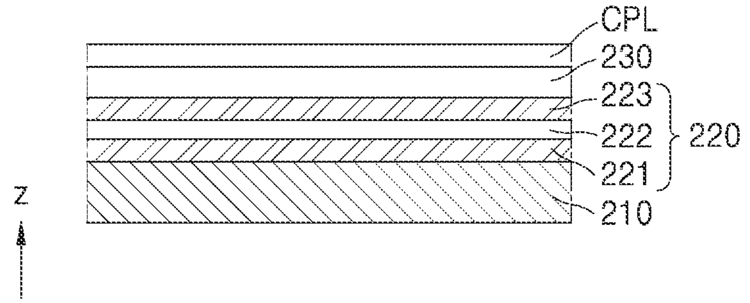
FIG. 6 is a schematic cross-sectional view of a light-emitting diode included in a display apparatus according to an embodiment.

FIG. 4 is a schematic plan view of a portion of a display apparatus according to an embodiment, FIG. 5 is a schematic cross-sectional view of the portion of the display apparatus according to an embodiment, and FIG. 6 is a schematic cross-sectional view of a light-emitting diode included in the display apparatus according to an embodiment.

FIG. 4 is an enlarged plan view of a region I of the display panel DP illustrated in FIG. 2, and FIG. 5 is a cross-sectional view of the display panel taken along a line II-II' of FIG. 4. For convenience of explanation, in FIG. 4, the first scan driving circuit 11, e.g., see FIG. 2, and the emission control driving circuit 13, e.g., see FIG. 2, described above with reference to FIG. 2 are omitted.

Referring to FIG. 4, a substrate 100 may include the display area DA and the non-display area NDA outside the display area DA. A plurality of pixels, for example, a first pixel P1, a second pixel P2, and a third pixel P3, may be arranged in the display area DA. The first to third pixels P1 to P3 may be emit light of different wavelengths from each other. For example, each of the first to third pixels P1 to P3 may emit red, green, blue, or white light.

A first common voltage supply line 610 may be arranged in the non-display area NDA outside the display area DA. The first common voltage supply line 610 may be arranged in parallel with an end 100E of the substrate 100 and may at least partially surround the display area DA. The first common voltage supply line 610 may have a first boundary 610E1 adjacent to the display area DA and a second boundary 610E adjacent to the end 100E of the substrate 100.

The first common voltage supply line 610 may be a portion of the common voltage supply line 16, e.g., see FIG. 2. The first common voltage supply line 610 may be arranged on the same layer as pixel electrodes 210, e.g., see FIG. 5, described below, for example, on a second organic insulating layer 111, e.g., see FIG. 5. The first common voltage supply line 610 may include the same material as the pixel electrodes 210, e.g., see FIG. 5.

Figure 7A:
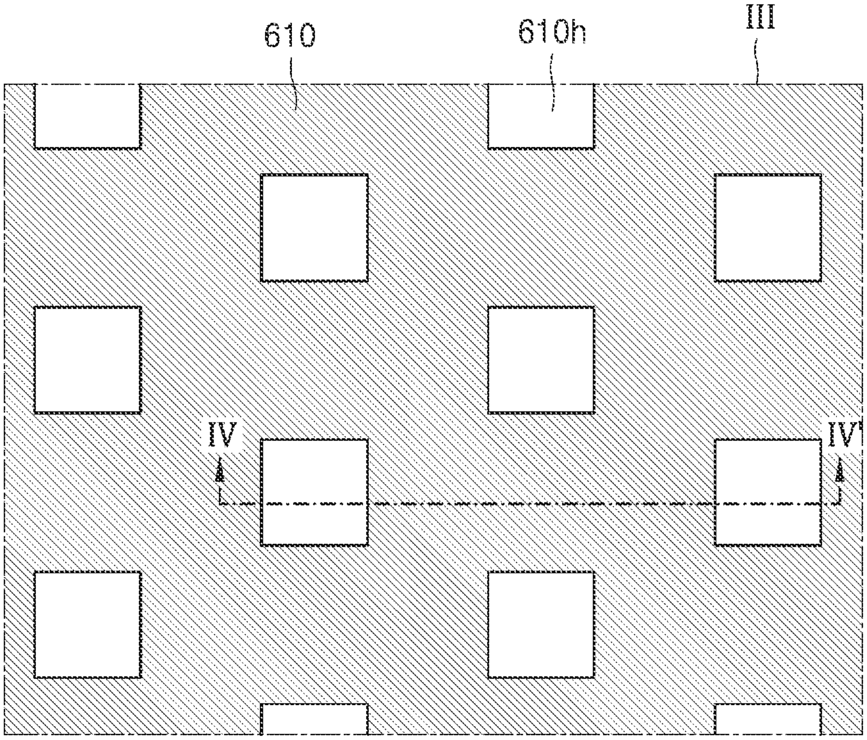
FIGS. 7A, 7B, 7C, and 7D are enlarged plan views of a region III of the display apparatus illustrated in FIG. 4.

In FIG. 4, it is omitted for convenience of drawing, but the first common voltage supply line 610 may include first holes 610*h*, e.g., see FIG. 7A, two-dimensionally arranged. The first holes 610*h* may provide a path to discharge gas included in a first organic insulating layer 109 and a second organic insulating layer 111 arranged below the first common voltage supply line 610. For example, during a manufacturing process of the display apparatus, when heat is applied to the first organic insulating layer 109 and/or the second organic insulating layer 111, a material included in the first organic insulating layer 109 and/or the second organic insulating layer 111 may be evaporated and discharged to the outside through the first holes 610*h*, e.g., see FIG. 7A. When there are no first holes 610*h*, e.g., see FIG. 7A, gas emitted from the first organic insulating layer 109 and/or the second organic insulating layer 111 may move toward the display area DA, and thus, defects may occur in pixels adjacent to the non-display area NDA.

A valley portion VA formed by removing a portion of the first organic insulating layer 109 and the second organic insulating layer 111 may be arranged to overlap the first common voltage supply line 610. The valley portion VA may be arranged to continually surround at least a portion of the display area DA and may prevent or reduce the penetration of impurities, such as moisture, etc., from the outside of the substrate 100 to the display area DA through an organic layer.

A metal bank layer 320 may extend from the display area DA to the non-display area NDA. The metal bank layer 320 may have a first pixel opening OP1, e.g., see FIG. 5, corresponding to an emission area of the first pixel P1, a second pixel opening OP2, e.g., see FIG. 5, corresponding to an emission area of the second pixel P2, and a third pixel opening OP3, e.g., see FIG. 5, corresponding to an emission area of the third pixel P3 in the display area DA. The metal bank layer 320 may have first bank holes 320*h*1 overlapping the first holes 610*h*, e.g., see FIG. 7A, penetrating and extending through the first common voltage supply line 610, in an area overlapping the first common voltage supply line 610. The first bank holes 320*h*1 may overlap the first holes 610*h* penetrating and extending through the first common voltage supply line 610 and may provide a path to discharge gas included in the first organic insulating layer 109 and the second organic insulating layer 111 arranged below the first common voltage supply line 610.

An end 320E of the metal bank layer 320 may be closer to the end 100E of the substrate 100 than the second boundary 610E2 of the first common voltage supply line 610. That is, the metal bank layer 320 may be arranged to cover the first common voltage supply line 610. The metal bank layer 320 may directly contact the first common voltage supply line 610 and may be configured to transmit the common voltage ELVSS to an opposite electrode of the light-emitting diode.

An encapsulation layer 500 may be arranged to cover the metal bank layer 320. The encapsulation layer 500 may include an inorganic encapsulation layer 510, e.g., see FIG. 5A, a planarization layer 520, e.g., see FIG. 5, and a protection layer 530, e.g., see FIG. 5. The encapsulation layer 500 may encapsulate the first to third pixels P1 to P3 and may extend from the display area DA to the non-display area NDA to cover the end 320E of the metal bank layer 320. For example, an end 500E of the encapsulation layer 500 may be closer to the end 100E of the substrate 100 than the end 320E of the metal bank layer 320.

As described below, the metal bank layer 320 may have an undercut structure, and thus, an intermediate layer included in the light-emitting diode may be formed to correspond to a pixel electrode, without an additional mask, such as a fine metal mask (FMM). Thus, a dam structure formed by stacking a plurality of organic layers configured to support a mask, etc. may be omitted, or the number of dam structures may be reduced, in the non-display area NDA, and thus, a display apparatus in which a dead space is reduced may be realized.

Referring to FIG. 5, the display area DA may include a first pixel area PA1 in which the first pixel P1 is arranged, a second pixel area PA2 in which the second pixel P2 is arranged, a third pixel area PA3 in which the third pixel P3 is arranged, and a non-pixel area NPA.

A first pixel circuit PC1 and a first light-emitting diode ED1 electrically connected to the first pixel circuit PC1 may be arranged in the first pixel area PA1, a second pixel circuit PC2 and a second light-emitting diode ED2 electrically connected to the second pixel circuit PC2 may be arranged in the second pixel area PA2, and a third pixel circuit PC3 and a third light-emitting diode ED3 electrically connected to the third pixel circuit PC3 may be arranged in the third pixel area PA3.

Each of the first to third light-emitting diodes ED1 to ED3 may include the pixel electrode 210, an intermediate layer 220, and an opposite electrode 230. For example, the first light-emitting diode ED1 may include a first pixel electrode 211, a first intermediate layer 2201, and a first opposite electrode 231. The second light-emitting diode ED2 may include a second pixel electrode 212, a second intermediate layer 2202, and a second opposite electrode 232. The third light-emitting diode ED3 may include a third pixel electrode 213, a third intermediate layer 2203, and a third opposite electrode 233.

The substrate 100 may include glass materials or polymer resins. The substrate 100 may have a stack structure including a base layer including polymer resins and an inorganic barrier layer. The polymer resins may include polyethersulfone (PES), polyacrylate (PAR), polyether imide (PEI), polyethylene naphthalate (PEN), polyethylene terephthalate (PET), polyphenylene sulfide (PPS), polyarylate, polyimide (PI), polycarbonate (PC), cellulose tri-acetate (TAC), and cellulose acetate propionate (CAP).

A buffer layer 101 may be arranged on an upper surface of the substrate 100. The buffer layer 101 may prevent the penetration of impurities into a semiconductor layer of a transistor. The buffer layer 101 may include an inorganic insulating material, such as $SiN_x$, SiON, and $SiO_2$, and may include a single layer or layers including the inorganic insulating materials described above.

The first pixel circuit PC1, the second pixel circuit PC2, and the third pixel circuit PC3 may be arranged on the buffer layer 101. Each of the first to third pixel circuits PC1 to PC3 may include a plurality of transistors and a storage capacitor as described above with reference to FIG. 3A or 3B. According to an embodiment, FIG. 5 illustrates the first transistor T1, the sixth transistor T6, and the storage capacitor Cst of the pixel circuit PC illustrated in FIG. 3B.

The first transistor T1 may include a first semiconductor layer A1 on the buffer layer 101 and a first gate electrode G1 overlapping a channel area of the first semiconductor layer A1. The first semiconductor layer A1 may include a silicon-based semiconductor material, for example, polysilicon. The first semiconductor layer A1 may include the channel area, and a first area and a second area arranged at both sides of the channel area, respectively. The first area and the second area include impurities having a higher concentration than impurities of the channel area, and any one of the first and second areas may correspond to a source area, and the other area may correspond to a drain area.

The sixth transistor T6 may include a sixth semiconductor layer A6 on the buffer layer 101 and a sixth gate electrode G6 overlapping a channel area of the sixth semiconductor layer A6. The sixth semiconductor layer A6 may include a silicon-based semiconductor material, for example, polysilicon. The sixth semiconductor layer A6 may include the channel area and first and second areas arranged at both sides of the channel area. The first and second areas may include impurities having a higher concentration than impurities of the channel area, and any one of the first and second areas may correspond to a source area, the other may correspond to a drain area.

The first gate electrode G1 and the sixth gate electrode G6 may include a conductive material including Mo, Al, Cu, Ti, etc. and may include a single layer or layers including the conductive material described above. A first gate insulating layer 103 may be arranged below the first gate electrode G1 and the sixth gate electrode G6 to electrically insulate the first gate electrode G1 and the sixth gate electrode G6 from the first semiconductor layer A1 and the sixth semiconductor layer A6. The first gate insulating layer 103 may include an inorganic insulating material, such as $SiN_x$, SiON, and $SiO_2$, and may include a single layer or layers including the inorganic insulating materials described above.

The storage capacitor Cst may include the lower electrode CE1 and the upper electrode CE2 overlapping each other. According to an embodiment, the lower electrode CE1 of the storage capacitor Cst may include the first gate electrode G1.

In other words, the first gate electrode G1 may include the lower electrode CE1 of the storage capacitor Cst. For example, the first gate electrode G1 and the lower electrode CE1 of the storage capacitor Cst may be integrally formed with each other.

A first interlayer insulating layer 105 may be arranged between the lower electrode CE1 and the upper electrode CE2 of the storage capacitor Cst. The first interlayer insulating layer 105 may include an inorganic insulating material, such as $SiO_2$, $SiN_x$, and SiON, and may include a single layer or layers including the inorganic insulating materials described above.

The upper electrode CE2 of the storage capacitor Cst may include a low resistance conductive material, such as Mo, Al, Cu, and/or Ti, and may include a single layer or layers including the material described above.

A second interlayer insulating layer 107 may be arranged on the storage capacitor Cst. The second interlayer insulating layer 107 may include an inorganic insulating material, such as $SiO_2$, $SiN_x$, and SiON, and may include a single layer or layers including the inorganic insulating materials described above.

A source electrode S1 and/or a drain electrode D1 electrically connected to the first semiconductor layer A1 of the first transistor T1 may be arranged on the second interlayer insulating layer 107. A source electrode S6 and/or a drain electrode D6 electrically connected to the sixth semiconductor layer A6 of the sixth transistor T6 may be arranged on the second interlayer insulating layer 107. The source electrodes S1 and S6 and/or the drain electrodes D1 and D6 may include A1, Cu, and/or Ti and may include a single layer or layers including the materials described above.

The second pixel circuit PC2 and the third pixel circuit PC3 may have the same or substantially the same structure as the first pixel circuit PC1.

The first organic insulating layer 109 may be arranged on the first to third pixel circuits PC1 to PC3. The first organic insulating layer 109 may include an organic insulating material, such as acryl, benzocyclobutene (BCB), PI, or hexamethyldisiloxane (HMDSO).

A contact metal CM may be arranged on the first organic insulating layer 109. The contact metal CM may include A1, Cu, and/or Ti and may include a single layer or layers including the materials described above.

The second organic insulating layer 111 may be arranged between the contact metal CM and the first to third pixel electrodes 211 to 213. The second organic insulating layer 111 may include an organic insulating material, such as acryl, BCB, PI, or HMDSO. According to an embodiment described with reference to FIG. 5, it is illustrated that the first pixel circuit PC1, the second pixel circuit PC2, and the third pixel circuit PC3 are respectively electrically connected to the first pixel electrode 211, the second pixel electrode 212, and the third pixel electrode 213, through the contact metal CM. However, according to an embodiment, the contact metal CM may be omitted, and one organic insulating layer may be arranged between the first to third pixel circuits PC1 to PC3 and the first to third pixel electrodes 211 to 213. Alternatively, three or more organic insulating layers may be arranged between the first to third pixel circuits PC1 to PC3 and the first to third pixel electrodes 211 to 213, and through a plurality of contact metals, the first to third pixel circuits PC1 to PC3 may be electrically connected to the first to third pixel electrodes 211 to 213, respectively.

The first to third pixel electrodes 211 to 213 may be formed on the second organic insulating layer 111. The first pixel electrode 211 may be electrically connected to the contact metal CM through a contact hole of the second organic insulating layer 111. The second pixel electrode 212 and the third pixel electrode 213 may have the same or substantially the same structure as the first pixel electrode 211.

An inorganic bank layer 310 may be arranged on the second organic insulating layer 111 to cover edges of the first to third pixel electrodes 211 to 213. In other words, the inorganic bank layer 310 may be formed on the entire second organic insulating layer 111 to cover the first to third pixel electrodes 211 to 213 and may have an opening extending to and exposing a central portion of each of the first to third pixel electrodes 211 to 213.

The inorganic bank layer 310 may include an inorganic insulating material, such as $SiO_2$, $SiN_x$, and SiON, and may include a single layer or layers including the inorganic insulating materials described above.

A first residual sacrificial layer 1131 may be arranged between the first pixel electrode 211 and the inorganic bank layer 310 to cover an edge of the first pixel electrode 211. The first residual sacrificial layer 1131 may be a portion of an electrode protection layer configured to prevent damage to the first pixel electrode 211 due to a gas or liquid material used in an etching process or an ashing process included in a manufacturing process of a display apparatus. For example, the electrode protection layer may be configured to protect an upper surface of the first pixel electrode 211 in a dry etching process for forming the first pixel opening OP1 described below. When the electrode protection layer is removed by using wet etching after the first pixel opening OP1 is formed, the first residual sacrificial layer 1131 may remain to cover the edge of the first pixel electrode 211. Likewise, a second residual sacrificial layer 1132 may be arranged between the second pixel electrode 212 and the inorganic bank layer 310 to cover an edge of the second pixel electrode 212, and a third residual sacrificial layer 1133 may be arranged between the third pixel electrode 213 and the inorganic bank layer 310 to cover an edge of the third pixel electrode 213. According to some embodiments, the electrode protection layer may be completely removed, and thus, the first to third residual sacrificial layers 1131 to 1133 may be omitted.

The first to third residual sacrificial layers 1131 to 1133 may include materials which may be selectively etched without damage to the pixel electrode 210. For example, the first to third residual sacrificial layers 1131 to 1133 may include conductive oxide, such as indium zinc oxide (IZO) and/or indium gallium zinc oxide (IGZO).

The first residual sacrificial layer 1131 and the inorganic bank layer 310 may overlap the edge of the first pixel electrode 211 and may increase a distance between the first pixel electrode 211 and the first opposite electrode 231 to prevent arcs, etc. from occurring between the first pixel electrode 211 and the first opposite electrode 231. Likewise, the second residual sacrificial layer 1132 and the inorganic bank layer 310 may overlap the edge of the second pixel electrode 212, and the third residual sacrificial layer 1133 and the inorganic bank layer 310 may overlap the edge of the third pixel electrode 213.

The metal bank layer 320 may be arranged on the inorganic bank layer 310 and may have the first pixel opening OP1 overlapping the first pixel electrode 211, the second pixel opening OP2 overlapping the second pixel electrode 212, and the third pixel opening OP3 overlapping the third pixel electrode 213. The metal bank layer 320 may be formed on the entire inorganic bank layer 310.

The metal bank layer 320 may include a first metal layer 321 and a second metal layer 323 including different metals from each other. The first metal layer 321 and the second metal layer 323 may include metals having different etch selectivities from each other. For example, the first metal layer 321 may include A1, and the second metal layer 323 may include Ti The second metal layer 323 may have a first tip PT1 extending from an upper surface of the first metal layer 321 toward a central portion of the first pixel opening OP1, a second tip PT2 extending from the upper surface of the first metal layer 321 toward a central portion of the second pixel opening OP2, and a third tip PT3 extending from the upper surface of the first metal layer 321 toward a central portion of the third pixel opening OP3. In other words, in the first to third pixel openings OP1 to OP3, the metal bank layer 320 may have an undercut structure in which a portion of the first metal layer 321 below the second metal layer 323 is removed.

The first intermediate layer 2201 may be arranged on the first pixel electrode 211 through the first pixel opening OP1. The first intermediate layer 2201 may include an emission layer emitting a first color of light. Likewise, the second intermediate layer 2202 including an emission layer emitting a second color of light may be arranged on the second pixel electrode 212 through the second pixel opening OP2, and the third intermediate layer 2203 including an emission layer emitting a third color of light may be arranged on the third pixel electrode 213 through the third pixel opening OP3.

According to an embodiment, the first intermediate layer 2201 may be deposited without an additional mask, and a deposition material for forming the first intermediate layer 2201 may form a first dummy intermediate layer 2201*dm* extending from an upper surface of the second metal layer 323 to a side surface of the first tip PT1. The first intermediate layer 2201 and the first dummy intermediate layer 2201*dm* may become separated and apart from each other by the first tip PT1.

According to an embodiment, the second intermediate layer 2202 may be deposited without an additional mask, and a deposition material for forming the second intermediate layer 2202 may form a second dummy intermediate layer 2202*dm* extending from the upper surface of the second metal layer 323 to a side surface of the second tip PT2. The second intermediate layer 2202 and the second dummy intermediate layer 2202*dm* may become separated and apart from each other by the second tip PT2.

According to an embodiment, the third intermediate layer 2203 may be deposited without an additional mask, and a deposition material for forming the third intermediate layer 2203 may form a third dummy intermediate layer 2203*dm* extending from the upper surface of the second metal layer 323 to a side surface of the third tip PT3. The third intermediate layer 2203 and the third dummy intermediate layer 2203*dm* may become separated and apart from each other by the third tip PT3.

The first opposite electrode 231 may be arranged on the first intermediate layer 2201 through the first pixel opening OP1. Likewise, the second opposite electrode 232 may be arranged on the second intermediate layer 2202 through the second pixel opening OP2, and the third opposite electrode 233 may be arranged on the third intermediate layer 2203 through the third pixel opening OP3.

According to an embodiment, the first opposite electrode 231 may be deposited without an additional mask, and a deposition material for forming the first opposite electrode 231 may form a first dummy opposite electrode layer 231*dm* extending from an upper surface of the first dummy intermediate layer 2201*dm* to a side surface of the first tip PT1. The first opposite electrode 231 and the first dummy opposite electrode layer 231*dm* may become separated and apart from each other by the first tip PT1.

According to an embodiment, the second opposite electrode 232 may be deposited without an additional mask, and a deposition material for forming the second opposite electrode 232 may form a second dummy opposite electrode layer 232*dm* extending from an upper surface of the second dummy intermediate layer 2202*dm* to a side surface of the second tip PT2. The second opposite electrode 232 and the second dummy opposite electrode layer 232*dm* may become separated and apart from each other by the second tip PT2.

According to an embodiment, the third opposite electrode 233 may be deposited without an additional mask, and a deposition material for forming the third opposite electrode 233 may form a third dummy opposite electrode layer 233*dm* extending from an upper surface of the third dummy intermediate layer 2203*dm* to the side surface of the third tip PT3. The third opposite electrode 233 and the third dummy opposite electrode layer 233*dm* may become separated and apart from each other by the third tip PT3.

According to some embodiments, the first to third intermediate layers 2201 to 2203 may be formed by using a heat deposition process, and the first to third opposite electrodes 231 to 233 may be formed by using a sputtering process. Thus, the deposition material for forming each of the first to third opposite electrodes 231 to 233 may be incident in a more oblique direction, based on a direction, e.g., a z direction, perpendicular to the substrate 100, than the deposition material for forming each of the first to third intermediate layers 2201 to 2203.

The first opposite electrode 231 may directly contact a side surface of the first metal layer 321, covered by the first tip PT1, and on which the first intermediate layer 2201 is not formed. Likewise, the second opposite electrode 232 may directly contact a side surface of the first metal layer 321, covered by the second tip PT2 and on which the second intermediate layer 2202 is not formed, and the third opposite electrode 233 may directly contact a side surface of the first metal layer 321, covered by the third tip PT3 and on which the third intermediate layer 2203 is not formed. Thus, the first to third opposite electrodes 231 to 233 may be electrically connected to the metal bank layer 320.

As described above, the metal bank layer 320 may be electrically connected to the common power supply line 16, e.g., see FIG. 2, and may be configured to transmit the common voltage ELVSS to the first to third opposite electrodes 231 to 233.

A first inorganic encapsulation layer 511 may be formed on the first opposite electrode 231 to encapsulate the first light-emitting diode ED1. The first inorganic encapsulation layer 511 may include an inorganic insulating material, such as $SiN_x$, SiON, and $SiO_2$, and may include a single layer or layers including the inorganic insulating materials described above.

The first inorganic encapsulation layer 511 may have a relatively excellent step coverage, and thus, may directly contact a lower surface of the first tip PT1 and a side surface of the first metal layer 321 to form an inorganic contact area completely surrounding the first light-emitting diode ED1. Thus, the first inorganic encapsulation layer 511 may reduce or prevent a path through which impurities, such as moisture and/or air, penetrate into the first light-emitting diode ED1.

Likewise, a second inorganic encapsulation layer 512 may directly contact a lower surface of the second tip PT2 and a side surface of the first metal layer 321 to form an inorganic contact area completely surrounding the second light-emitting diode ED2. A third inorganic encapsulation layer 513 may directly contact a lower surface of the third tip PT3 and a side surface of the first metal layer 321 to form an inorganic contact area completely surrounding the third light-emitting diode ED3.

The planarization layer 520 may be arranged on an inorganic encapsulation layer 510 including the first to third inorganic encapsulation layers 511 to 513. The planarization layer 520 may bury the first to third pixel openings OP1 to OP3 of the metal bank layer 320 to provide a flat base surface for components arranged above the planarization layer 520. The planarization layer 520 may include a polymer-based material. The polymer-based material may include acryl-based resins, epoxy-based resins, PI, polyethylene, etc.

The protection layer 530 may be arranged on the planarization layer 520. The protection layer 530 may include one or more inorganic materials from among aluminum oxide, titanium oxide, tantalum oxide, hafnium oxide, zinc oxide, silicon oxide, silicon nitride, and silicon oxynitride. The protection layer 530 may prevent damage to the planarization layer 520 in subsequent processes.

Referring to FIG. 6, each of light-emitting diodes respectively corresponding to the first to third light-emitting diodes ED1 to ED3 may include the pixel electrode 210, the intermediate layer 220, and the opposite electrode 230. The intermediate layer 220 may include an emission layer 222.

The pixel electrode 210 may be formed as a (half) transparent electrode or a reflection electrode. When the pixel electrode 210 is formed as a (half) transparent electrode, the pixel electrode 210 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is formed as a reflection electrode, a reflective layer including Ag, Mg, Al, Pt, Pd, Au, Ni, Nd, Ir, Cr, or compound thereof may be formed, and a layer including ITO, IZO, ZnO, or $In_2O_3$ may be formed on the reflective layer. According to an embodiment, the pixel electrode 210 may have a structure in which an ITO layer, an Ag layer, and an ITO layer are sequentially stacked.

The intermediate layer 220 may include a functional layer arranged between the pixel electrode 210 and the emission layer 222 and/or between the emission layer 222 and the opposite electrode 230. Hereinafter, the functional layer between the pixel electrode 210 and the emission layer 222 is referred to as a first functional layer 221, and the functional layer between the emission layer 222 and the opposite electrode 230 is referred to as a second functional layer 223.

The emission layer 222 may include a high molecular-weight or low molecular-weight organic material emitting light of a predetermined color, e.g., red, green, or blue. According to an embodiment, the emission layer 222 may include an inorganic material or quantum dots.

The first functional layer 221 may include a hole transport layer (HTL) and/or a hole injection layer (HIL). The second functional layer 223 may include an electron transport layer (ETL) and/or an electron injection layer (EIL). The first functional layer 221 and the second functional layer 223 may include an organic material.

The intermediate layer 220 may have a single-stack structure including a single emission layer or a tandem structure, which is a multi-stack structure, including a plurality of emission layers. In the case of the tandem structure, a charge generation layer (CGL) may be arranged between the plurality of stacks.

The opposite electrode 230 may include a conductive material having a low work function. For example, the opposite electrode 230 may include a (half) transparent layer including Ag, Mg, Al, Pt, Pd, Au, Ni, Nd, Ir, Cr, Li, Ca, or an alloy thereof. Alternatively, the opposite electrode 230 may further include a layer, such as ITO, IZO, ZnO, or $In_2O_3$, on the (half) transparent layer including the materials described above.

A capping layer CPL may be arranged on the opposite electrode 230. The capping layer CPL may be provided to protect the opposite electrode 230 and at the same time increase the light extraction efficiency. A refractive index of the capping layer CPL may be higher than a refractive index of the opposite electrode 230. Alternatively, the refractive index of the capping layer CPL may be formed by a stack of different layers. For example, the refractive index of the capping layer CPL may be about 1.7 to about 1.9. The capping layer CPL may include an organic material and may additionally include an inorganic insulating material such as LiF.

FIGS. 7A to 7D are enlarged plan views of a region III of the display apparatus illustrated in FIG. 4, and FIGS. 8A to 8C are cross-sectional views of the display apparatus illustrated in FIG. 7A, taken along a line IV-IV'.

Referring to FIGS. 7A to 7D and 8A, the buffer layer 101, the first gate insulating layer 103, the first interlayer insulating layer 105, the second interlayer insulating layer 107, the first organic insulating layer 109, and the second organic insulating layer 111 may be sequentially stacked on the non-display area NDA of the substrate 100. According to some embodiments, any one of the buffer layer 101, the first gate insulating layer 103, the first interlayer insulating layer 105, the second interlayer insulating layer 107, the first organic insulating layer 109, and the second organic insulating layer 111 may be omitted.

The first common voltage supply line 610 may be arranged on the same layer as the pixel electrodes 210, e.g., see FIG. 5. For example, the first common voltage supply line 610 may be arranged on the second organic insulating layer 111. The first common voltage supply line 610 may have the first holes 610*h* two-dimensionally arranged, as described above. The first holes 610*h* may provide a path for discharging gas included in the first organic insulating layer 109 and the second organic insulating layer 111 arranged below the first common voltage supply line 610.

The first common voltage supply line 610 may include the same material as the pixel electrodes 210, e.g., see FIG. 5. According to an embodiment, the first common voltage supply line 610 may have a structure in which an ITO layer, an Ag layer, and an ITO layer are sequentially stacked.

Figure 7B:
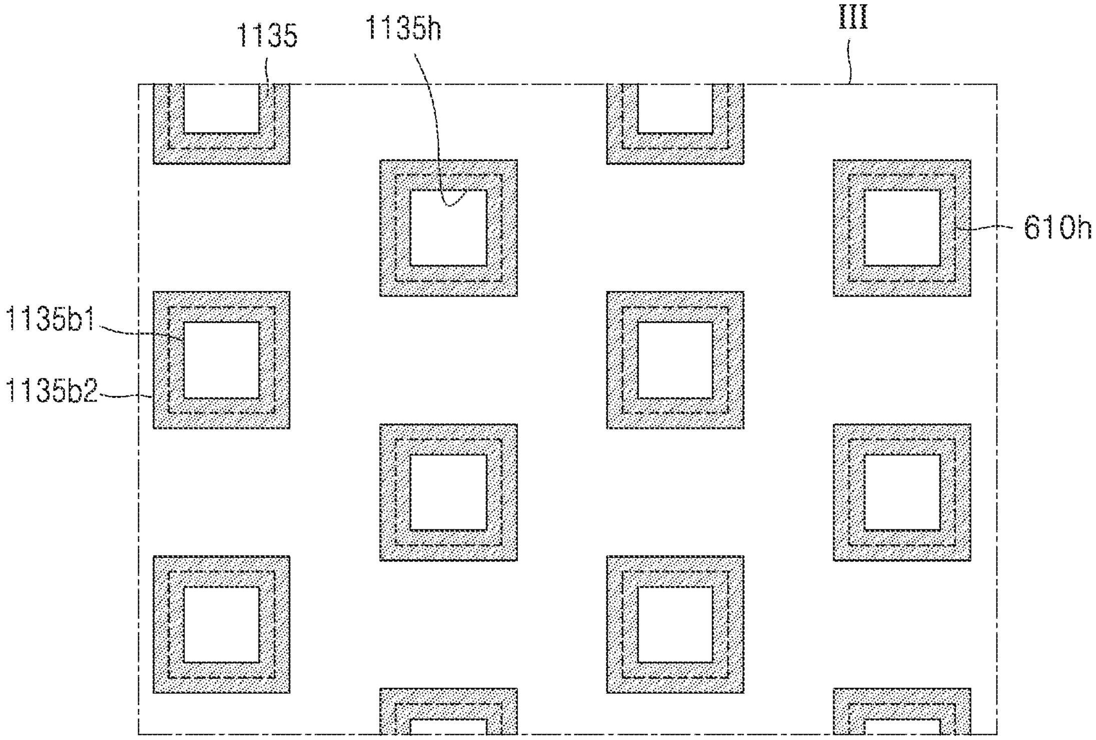
Figure 8A:
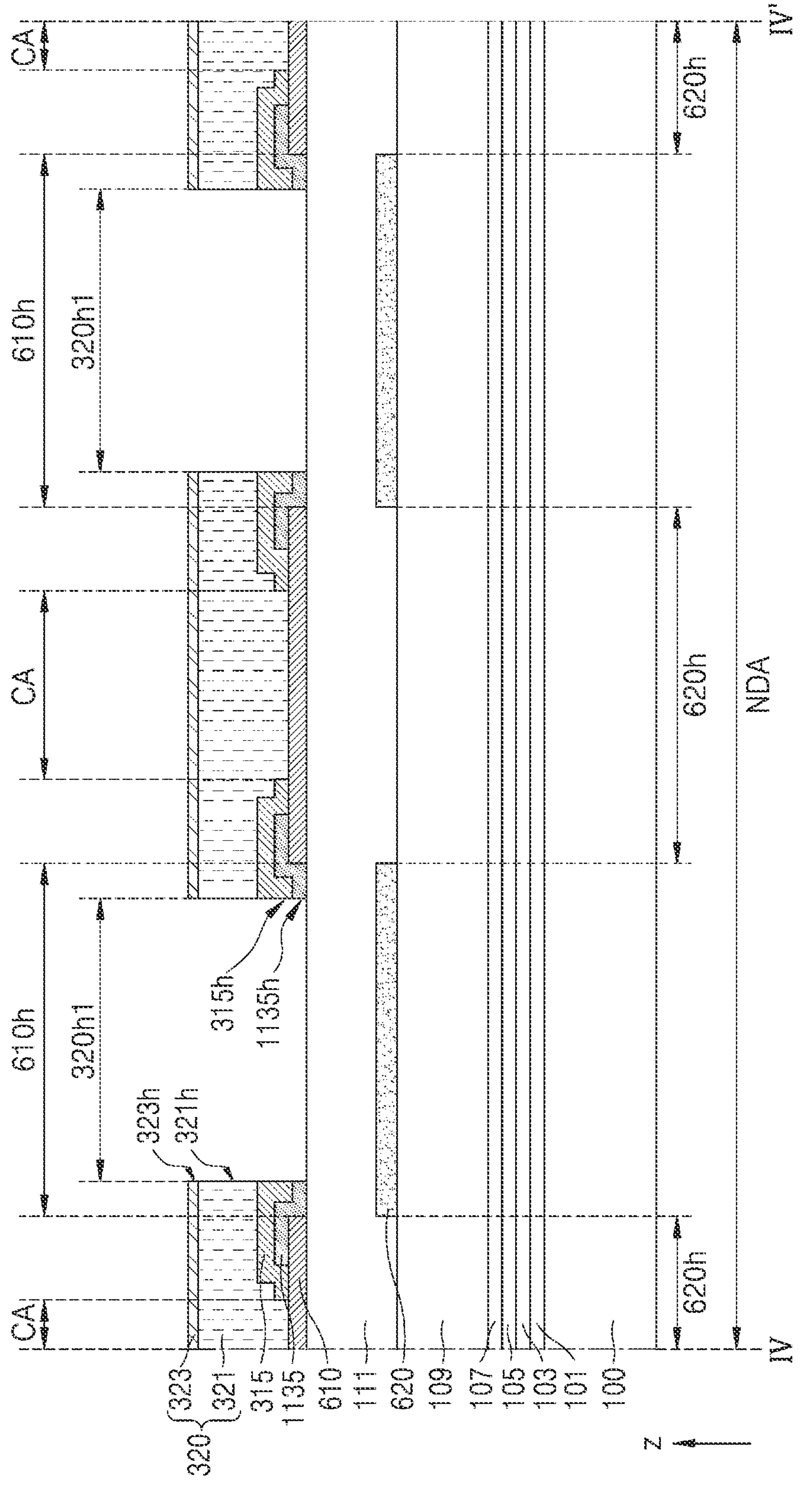
FIGS. 8A, 8B, and 8C are cross-sectional views of the display apparatus illustrated in FIG. 7A, taken along a line IV-IV'.
Figure 8B:
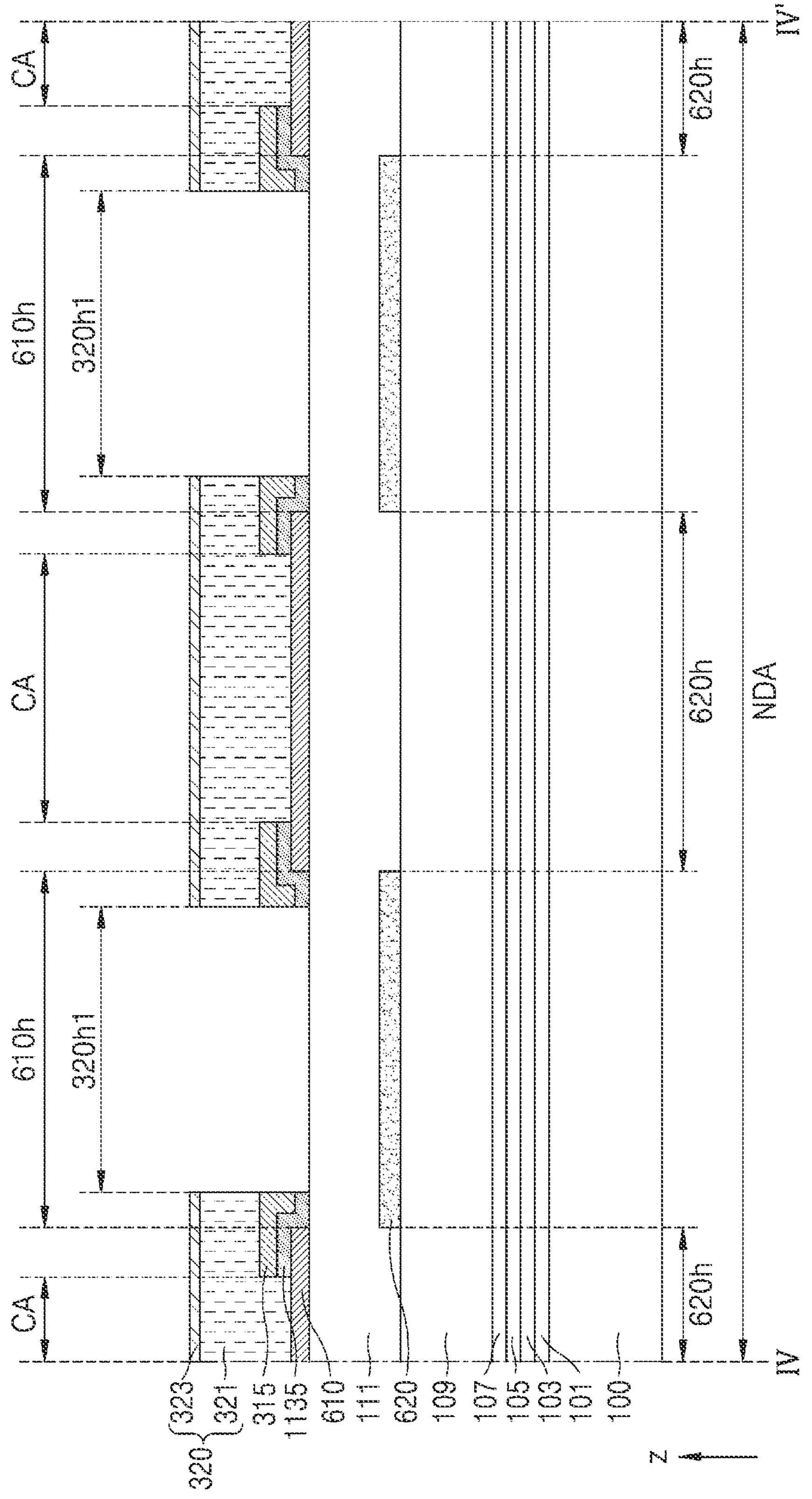

Sacrificial patterns 1135 may be arranged to cover edges of the first holes 610*h* of the first common voltage supply line 610. The sacrificial pattern 1135 may have a first sub-hole 1135*h* overlapping the first hole 610*h* of the first common voltage supply line 610. A width (or an area) of the first sub-hole 1135*h* may be less than or equal to a width (or an area) of the first hole 610*h*. For example, as illustrated in FIGS. 7B, 8A, and 8B, a first boundary 1135*b*1 of the sacrificial pattern 1135 having the first sub-hole 1135*h* may be arranged at an inner portion of the first hole 610*h* of the first common voltage supply line 610 in a plan view. A second boundary 1135*b*2 of the sacrificial pattern 1135 may be arranged at an outer portion of the first hole 610*h*, and thus, the sacrificial pattern 1135 may cover an edge of the first hole 610*h*.

The sacrificial pattern 1135 may be arranged on the same layer as the first residual sacrificial layer 1131, the second residual sacrificial layer 1132, and the third residual sacrificial layer 1133. The sacrificial pattern 1135 may include the same material as the first residual sacrificial layer 1131, the second residual sacrificial layer 1132, and the third residual sacrificial layer 1133. For example, the sacrificial pattern 1135 may include conductive oxide, such as IZO and/or IGZO.

Figure 7C:
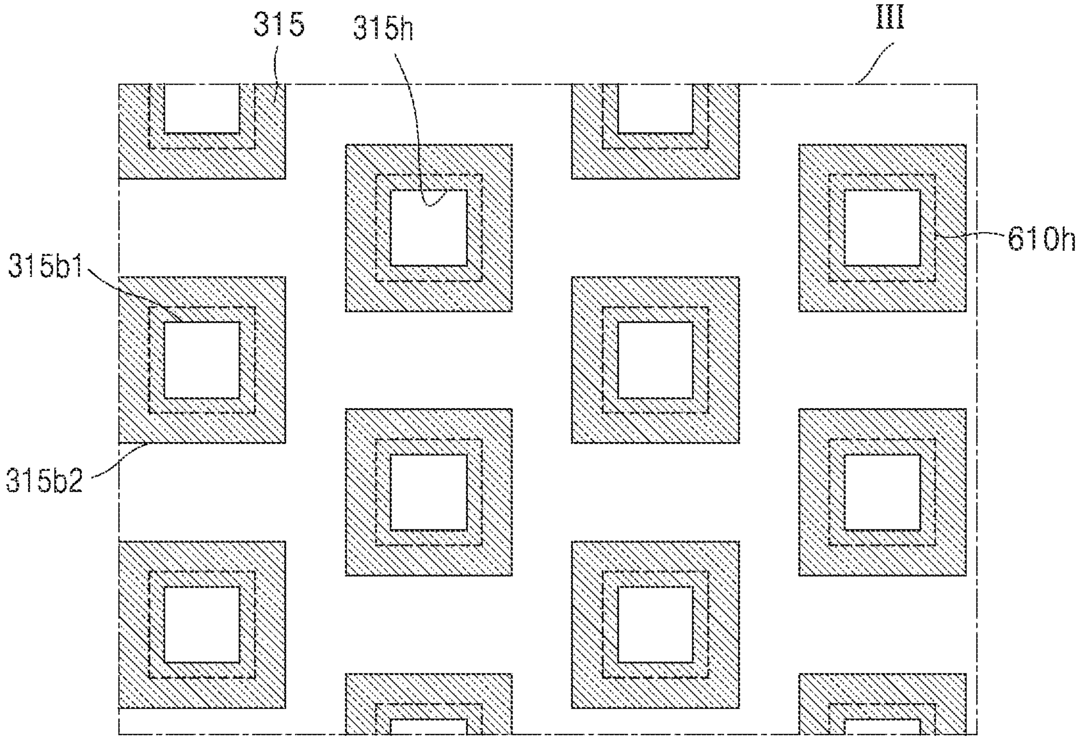

A first inorganic pattern 315 may be arranged on the sacrificial pattern 1135. The first inorganic pattern 315 may have a second sub-hole **315*h* overlapping the first hole 610*h* of the first common voltage supply line 610. A width (or an area) of the second sub-hole 315*h* may be less than or equal to the width (or the area) of the first hole 610*h*. For example, as illustrated in FIGS. 7C, 8A, and 8B, a first boundary 315*b*1 of the first inorganic pattern 315 having the second sub-hole 315*h* may be arranged at an inner portion of the first hole 610*h* of the first common voltage supply line 610 in a plan view. A second boundary 315*b*2 of the first inorganic pattern 315 may be arranged at an outer portion of the first hole 610*h*, and thus, the first inorganic pattern 315 may cover an edge of the first hole 610*h***.

FIGS. 7C and 8A illustrate a case in which the second boundary **315*b*2 of the first inorganic pattern 315 is arranged at an outer portion of the second boundary 1135*b*2 of the sacrificial pattern 1135. However, as illustrated in FIG. 8B, the second boundary 315*b*2 of the first inorganic pattern 315 and the second boundary 1135*b*2 of the sacrificial pattern 1135 may correspond to each other in an embodiment. Also, according to an embodiment, the second boundary 315*b*2 of the first inorganic pattern 315 may be arranged at an inner portion of the second boundary 1135*b*2 of the sacrificial pattern 1135**.

According to an embodiment, the sacrificial pattern 1135 may be a portion remaining after removing a protection pattern for protecting an upper surface of the second organic insulating layer 111 exposed through the first hole **610*h* in a process of removing a portion of the metal bank layer 320 and the first inorganic pattern 315**.

The first inorganic pattern 315 may be arranged on the same layer as the inorganic bank layer 310. The first inorganic pattern 315 may include the same material as the inorganic bank layer 310. For example, the first inorganic pattern 315 may include an inorganic insulating material, such as $SiO_2$, $SiN_x$, and SiON, and may include a single layer or layers including the inorganic insulating materials described above.

Figure 7D:
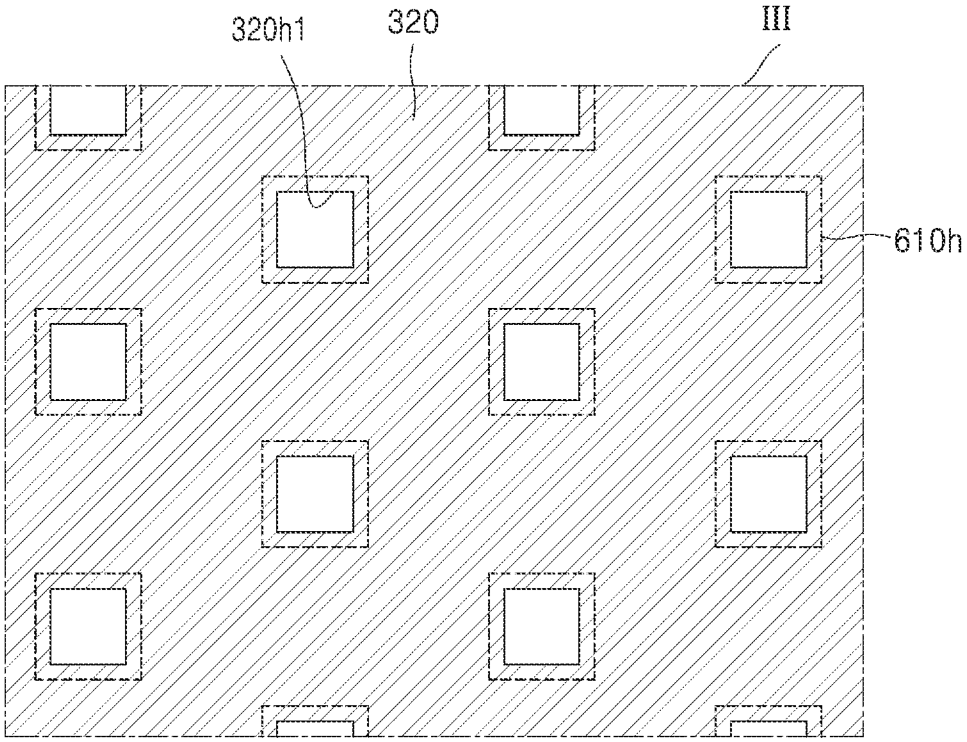

The metal bank layer 320 may be arranged on the first inorganic pattern 315. The metal bank layer 320 may extend from the display area DA to the non-display area NDA. The metal bank layer 320 may have a first bank hole **320*h*1 overlapping the first hole 610*h*. A width (or an area) of the first bank hole 320*h*1 may be less than or approximately equal to the width (or the area) of the first hole 610*h*. For example, as illustrated in FIGS. 7D, 8A, and 8B, the boundary of the first bank hole 320*h*1 may be arranged at an inner portion of the boundary of the first hole 610*h*** in a plan view.

As described with reference to FIG. 5, the metal bank layer 320 may include the first metal layer 321 and the second metal layer 323. In the non-display area NDA, the first metal layer 321 may have a third sub-hole **321*h* overlapping the first hole 610*h* of the first common voltage supply line 610, and the second metal layer 323 may have a fourth sub-hole 323*h* overlapping the first hole 610*h*. As illustrated in FIG. 8A, the first sub-hole 1135*h*, the second sub-hole 315*h*, the third sub-hole 321*h*, and the fourth sub-hole 323*h* may have a continuous side wall. In other words, a width (or an area) of the first sub-hole 1135*h*, a width (or an area) of the second sub-hole 315*h*, a width (or an area) of the third sub-hole 321*h*, and a width (or an area) of the fourth sub-hole 323*h*** may be substantially the same as or similar to each other.

According to some embodiments, the first common voltage supply line 610 may include Ag. In this case, the sacrificial pattern 1135, the first inorganic pattern 315, and the metal bank layer 320 may be cladded on the boundary of the first holes **610*h*, to prevent or reduce the extraction of Ag from the first common voltage supply line 610**.

Figure 8C:
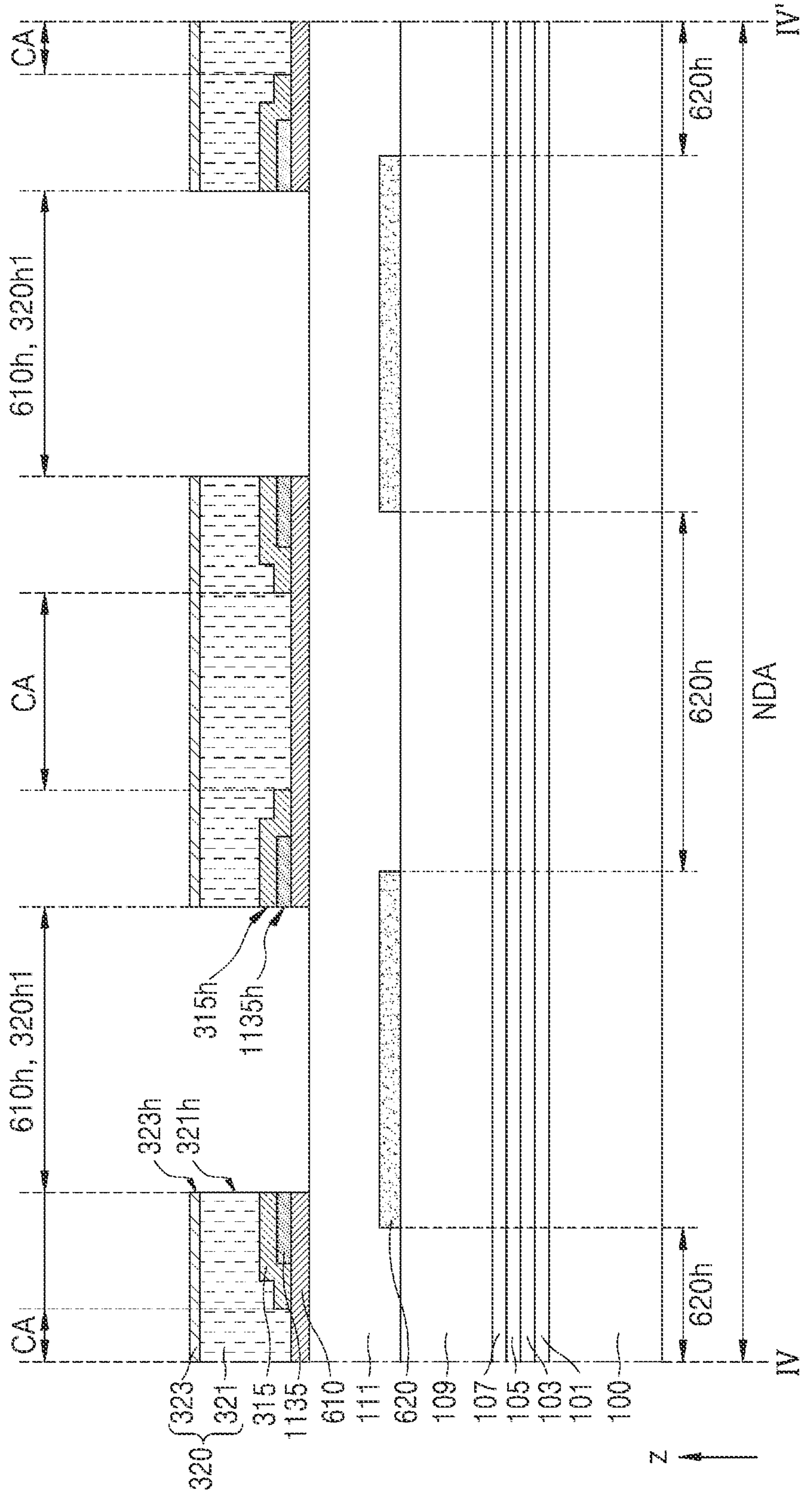

FIGS. 8A and 8B illustrate that the width (or the area) of the first sub-hole **1135*h*, the width (or the area) of the second sub-hole 315*h*, the width (or the area) of the third sub-hole 321*h*, and the width (or the area) of the fourth sub-hole 323*h* are less than a width (or an area) of the first common voltage supply line 610. However, as illustrated in FIG. 8C, the width (or the area) of the first sub-hole 1135*h*, the width (or the area) of the second sub-hole 315*h*, the width (or the area) of the third sub-hole 321*h*, and the width (or the area) of the fourth sub-hole 323*h* may be substantially the same as or similar to the width (or the area) of the first hole 610*h*. In this case, the first sub-hole 1135*h*, the second sub-hole 315*h*, the third sub-hole 321*h*, the fourth sub-hole 323*h*, and the first hole 610*h*** may be patterned by using the same process or a continual process.

The first metal layer 321 may directly contact the first common voltage supply line 610 in a contact area CA outside the sacrificial pattern 1135 and the first inorganic pattern 315. Thus, the metal bank layer 320 may be electrically connected to the first common voltage supply line 610.

A second common voltage supply line 620 may be arranged between the first organic insulating layer 109 and the second organic insulating layer 111. The second common voltage supply line 620 may be electrically connected to the first common voltage supply line 610 and may form the common power supply line 16, e.g., see FIG. 2. The second common voltage supply line 620 may be arranged to overlap the first common voltage supply line 610 and may include second holes **620*h* two-dimensionally arranged to be apart from the first holes 610*h*. The second common voltage supply line 620 may be arranged on the same layer as the contact metal CM, e.g., see FIG. 5. The second common voltage supply line 620 may include the same material as the contact metal CM. For example, the second common voltage supply line 620** may include Al, Cu, and/or Ti and may include a single layer or layers including the materials described above.

Figure 9:
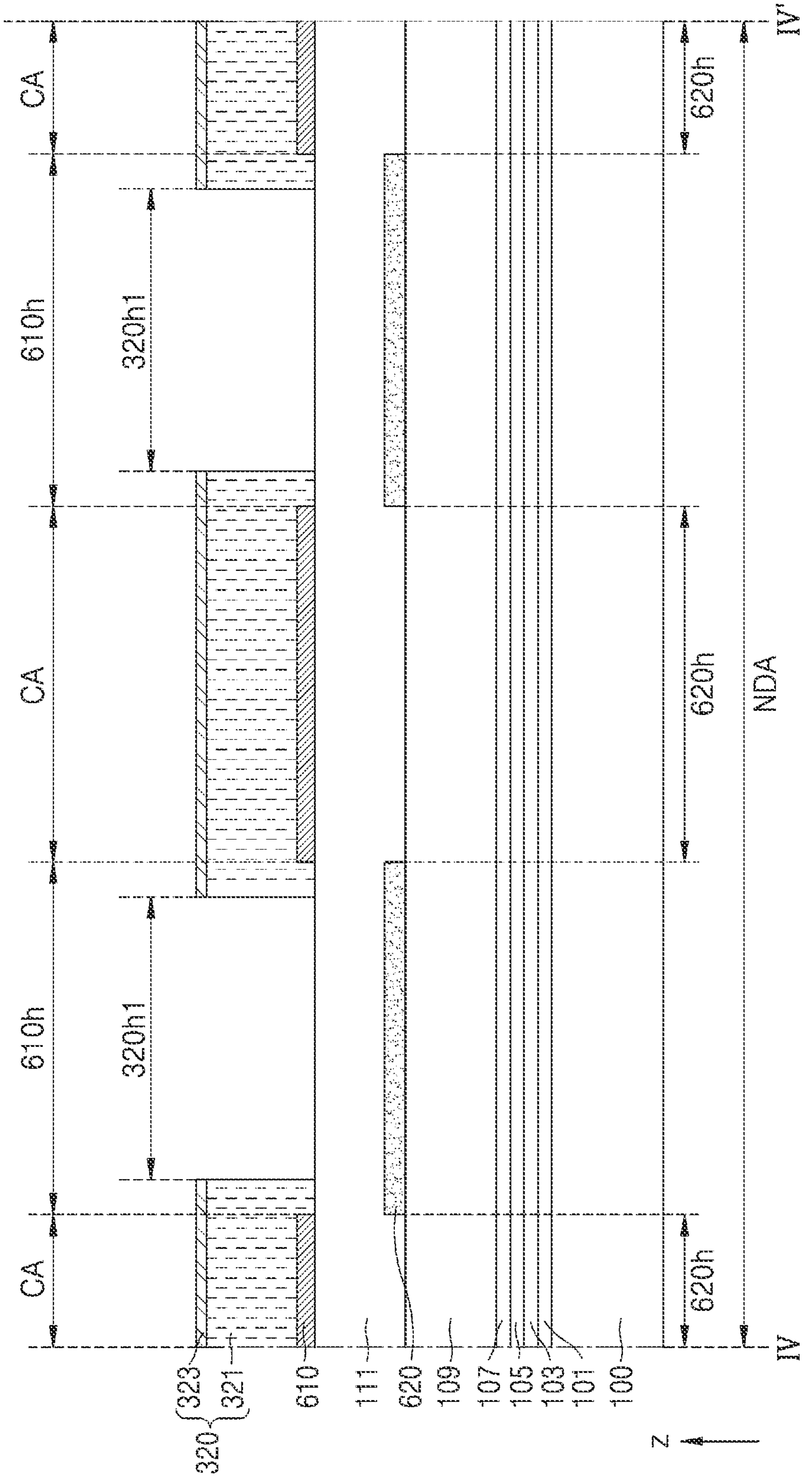
FIG. 9 is a schematic cross-sectional view of a portion of a display apparatus according to an embodiment.

FIG. 9 is a schematic cross-sectional view of a portion of a display apparatus according to an embodiment. FIG. 9 is substantially the same as FIG. 8A. However, there is a difference in that the sacrificial pattern 1135, e.g., see FIG. 8A, and the first inorganic pattern 315, e.g., see FIG. 8A, are omitted.

Referring to FIG. 9, the metal bank layer 320 may be arranged on the first common voltage supply line 610 having the first holes **610*h*. The metal bank layer 320 may include the first metal layer 321 and the second metal layer 323 and may have the first bank hole 320*h*1 penetrating and extending through the metal bank layer 320. The first bank holes 320*h*1 may be arranged to overlap the first holes 610*h*, respectively, and a width (or an area) of the first bank hole 320*h*1 may be less than a width (or an area) of the first hole 610*h*. Thus, the metal bank layer 320 may cover an edge of the first hole 610*h*. In other words, a boundary of the first bank hole 320_h_1 may be arranged at an inner portion of a boundary of the first hole 610**_h_ in a plan view.

There may be no insulating layer between the first common voltage supply line 610 and the metal bank layer 320, and thus, the entire surface of the first common voltage supply line 610 may directly contact the metal bank layer 320. Thus, the contact area CA of the metal bank layer 320 and the first common voltage supply line 610 may be increased to decrease the resistance.

Figure 10:
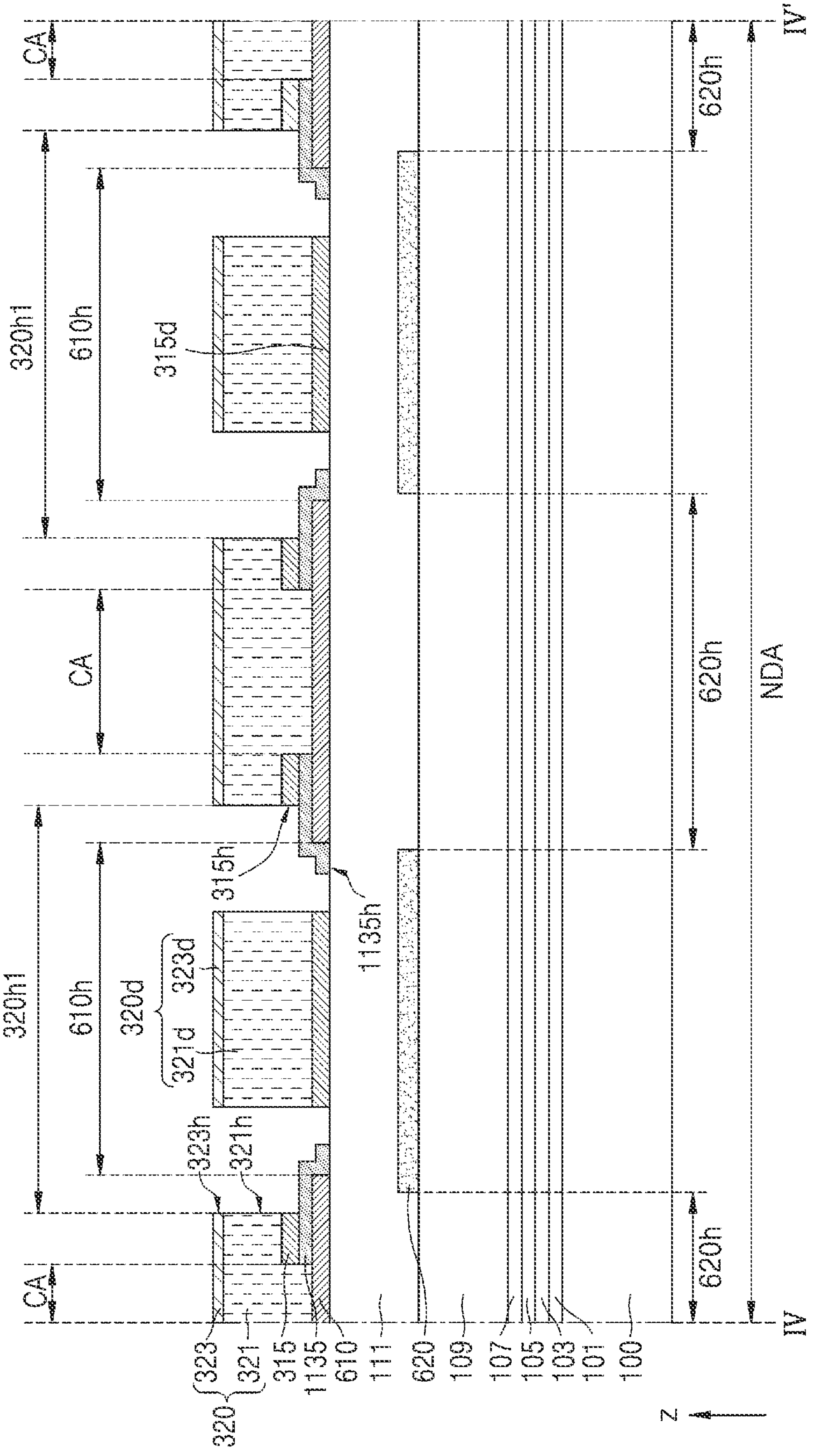
FIG. 10 is a schematic cross-sectional view of a portion of a display apparatus according to an embodiment.

FIG. 10 is a schematic cross-sectional view of a portion of a display apparatus according to an embodiment.

Referring to FIG. 10, the buffer layer 101, the first gate insulating layer 103, the first interlayer insulating layer 105, the second interlayer insulating layer 107, the first organic insulating layer 109, and the second organic insulating layer 111 may be sequentially stacked on the non-display area NDA of the substrate 100. According to some embodiments, any one of the buffer layer 101, the first gate insulating layer 103, the first interlayer insulating layer 105, the second interlayer insulating layer 107, the first organic insulating layer 109, and the second organic insulating layer 111 may be omitted.

The first common voltage supply line 610 may be arranged on the same layer as the pixel electrodes 210, e.g., see FIG. 5. For example, the first common voltage supply line 610 may be arranged on the second organic insulating layer 111. The first common voltage supply line 610 may have the first holes 610_h_ two-dimensionally arranged, as described above. The first holes 610_h_ may provide a path for discharging gas included in the first organic insulating layer 109 and the second organic insulating layer 111 arranged below the first common voltage supply line 610.

The second common voltage supply line 620 may be arranged on the same layer as the contact metals CM, e.g., see FIG. 5, for example, on the first organic insulating layer 109. The second common voltage supply line 620 may have second holes 620_h_ two-dimensionally arranged not to overlap the first holes 610_h_.

The sacrificial patterns 1135 may be arranged to cover edges of the first holes 610_h_ of the first common voltage supply line 610. The sacrificial pattern 1135 may have the first sub-holes 1135_h_ overlapping the first holes 610_h_ of the first common voltage supply line 610. A width (or an area) of the first sub-hole 1135_h_ may be less than a width (or an area) of the first hole 610_h_.

The sacrificial pattern 1135 may be arranged on the same layer as the first residual sacrificial layer 1131, e.g., see FIG. 5, the second residual sacrificial layer 1132, e.g., see FIG. 5, and the third residual sacrificial layer 1133, e.g., see FIG. 5. The sacrificial pattern 1135 may include the same material as the first residual sacrificial layer 1131, e.g., see FIG. 5, the second residual sacrificial layer 1132, e.g., see FIG. 5, and the third residual sacrificial layer 1133, e.g., see FIG. 5.

The first inorganic pattern 315 may be arranged on the sacrificial pattern 1135. The first inorganic pattern 315 may have the second sub-hole 315_h_ overlapping the first hole 610_h_ of the first common voltage supply line 610. A width (or an area) of the second sub-hole 315_h_ may be greater than the width (or the area) of the first hole 610_h_. For example, a boundary of the second sub-hole 315_h_ may be arranged at an outer portion of the first hole 610_h_ in a plan view.

The metal bank layer 320 may be arranged on the first inorganic pattern 315. The metal bank layer 320 may have the first bank hole 320_h_1 overlapping the first hole 610_h_ of the first common voltage supply line 610. A width (or an area) of the first bank hole 320_h_1 may be greater than the width (or the area) of the first hole 610_h_. For example, a boundary of the first bank hole 320_h_1 may be arranged at an outer portion of the boundary of the first hole 610_h_ in a plan view.

The metal bank layer 320 may include the first metal layer 321 and the second metal layer 323. The first metal layer 321 may directly contact the first common voltage supply line 610 in the contact area CA outside the sacrificial pattern 1135 and the first inorganic pattern 315. Thus, the metal bank layer 320 may be electrically connected to the first common voltage supply line 610.

The first metal layer 321 may have the third sub-hole 321_h_ overlapping the first hole 610_h_ of the first common voltage supply line 610, and the second metal layer 323 may have the fourth sub-hole 323_h_ overlapping the first hole 610_h_ in the non-display area NDA. The third sub-hole 321_h_ and the fourth sub-hole 323_h_ may have a continuous side wall and may form the first bank hole 320_h_1.

A dummy metal bank layer 320_d_ may be arranged to overlap the first bank hole 320_h_1. As illustrated in FIG. 10, the dummy metal bank layer 320_d_ may be apart from the metal bank layer 320, the first inorganic pattern 315, and the sacrificial pattern 1135, to obtain a path for discharging gas generated in the first organic insulating layer 109 and the second organic insulating layer 111.

According to some other embodiments, the dummy metal bank layer 320_d_ may cover an edge of the first hole 610_h_ of the first common voltage supply line 610. In this case, the dummy metal bank layer 320_d_ may be cladded on a boundary of the first hole 610_h_ of the first common voltage supply line 610 to prevent or reduce the extraction of Ag from the first common voltage supply line 610.

The metal bank layer 320 may include a first dummy metal layer 321_d_ and a second dummy metal layer 323_d_, and the first dummy metal layer 321_d_ may include the same material as the first metal layer 321, and the second dummy metal layer 323_d_ may include the same material as the second metal layer 323.

FIG. 10 illustrates that the sacrificial pattern 1135 covers the edge of the first hole 610_h_. However, according to some embodiments, the sacrificial pattern 1135 may be omitted, or the sacrificial pattern 1135 and the first inorganic pattern 315 may be omitted.

Figure 11:
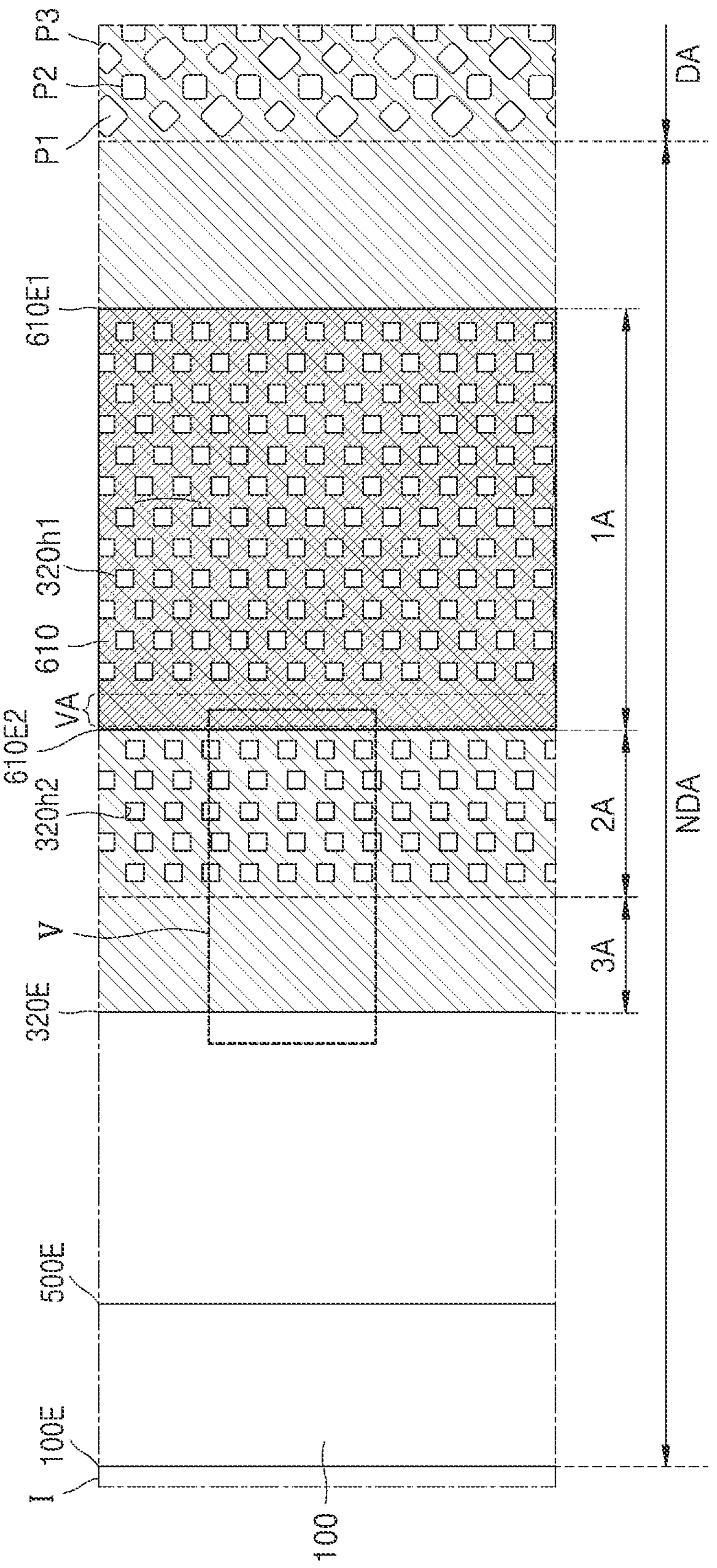
FIG. 11 is a schematic plan view of a portion of a display apparatus according to an embodiment.
Figure 12:
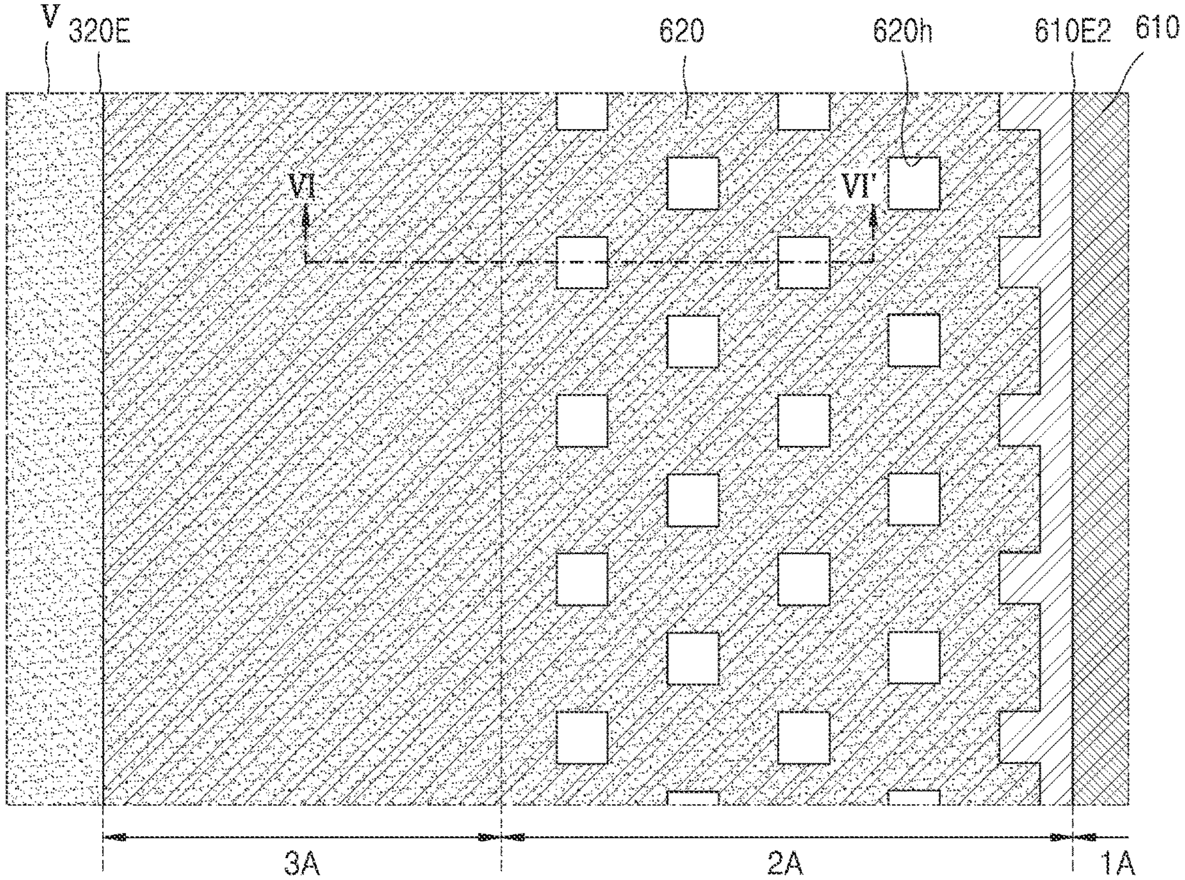
FIG. 12 is an enlarged plan view of region V of the display apparatus illustrated in FIG. 11.
Figure 13:
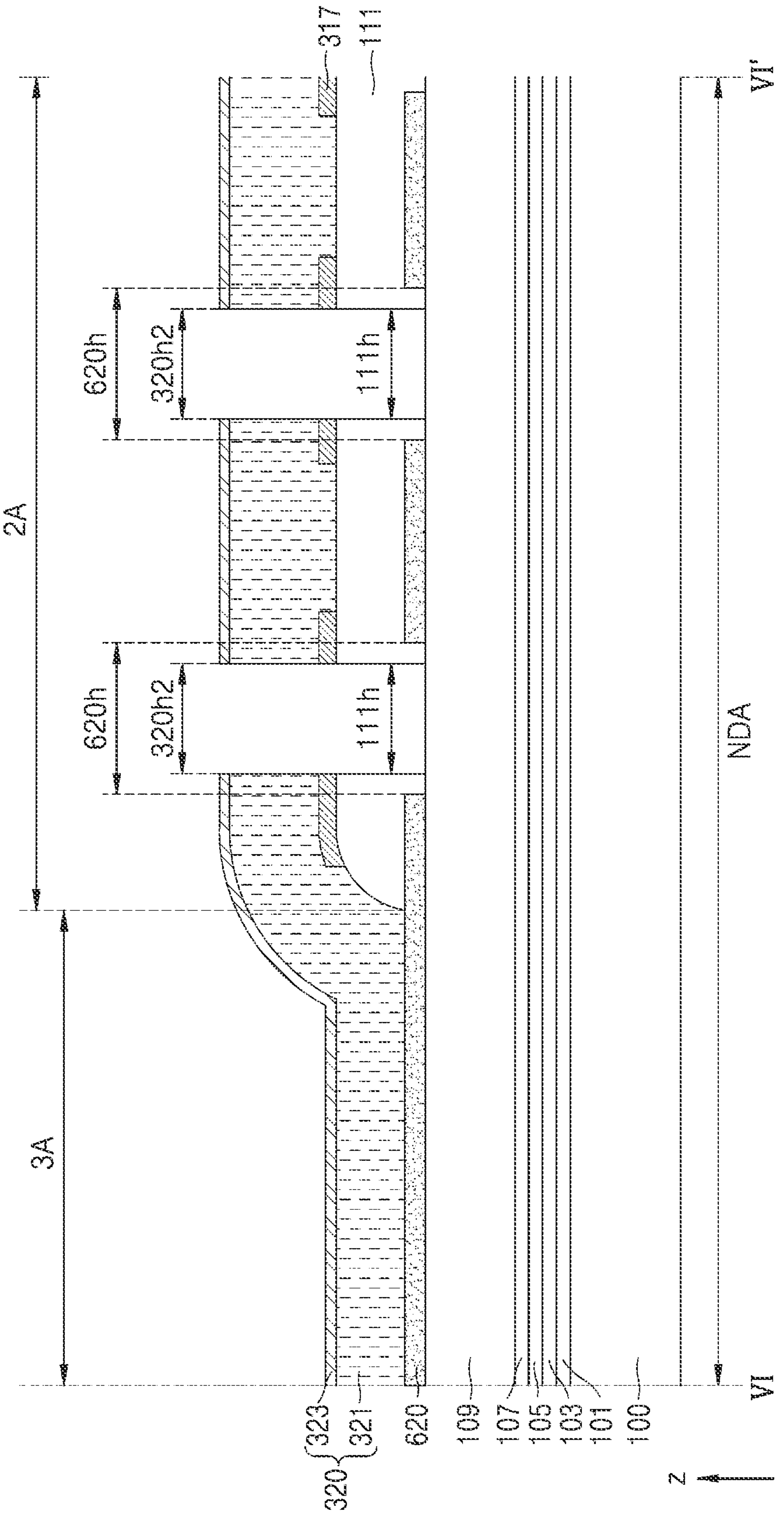
FIG. 13 is a cross-sectional view of the display apparatus illustrated in FIG. 12, taken along a line VI-VI'.

FIG. 11 is a schematic plan view of a portion of a display apparatus according to an embodiment, FIG. 12 is an enlarged plan view of a region V of the display apparatus illustrated in FIG. 11, and FIG. 13 is a cross-sectional view of the display apparatus illustrated in FIG. 12, taken along a line VI-VI'. FIG. 11 is similar to FIG. 4. However, there is a difference in that the second boundary 610E2 of the first common voltage supply line 610 is arranged to be adjacent to the valley portion VA.

Referring to FIGS. 11 to 13, the substrate 100 may include a display area DA and a non-display area NDA outside the display area DA. A plurality of pixels, for example, a first pixel P1, a second pixel P2, and a third pixel P3, may be arranged in the display area DA.

The first common voltage supply line 610 may be arranged in the non-display area NDA outside the display area DA. An area overlapping the first common voltage supply line 610 may be defined as a first area 1A. In other words, the first area 1A may be defined by the first boundary 610E1 and the second boundary 610E of the first common voltage supply line 610. The first common voltage supply line 610 may be arranged in parallel with the end 100E of the substrate 100 to surround at least a portion of the display area DA.

The first common voltage supply line 610 may be a portion of the common power supply line 16, e.g., see FIG. 2. The first common voltage supply line 610 may be arranged on the same layer as the pixel electrodes 210, e.g., see FIG. 6, for example, on the second organic insulating layer 111.

The first common voltage supply line 610 may have the first holes 610*h* two-dimensionally arranged. The first holes 610*h* may provide a path for discharging gas included in the first organic insulating layer 109 and the second organic insulating layer 111 arranged below the first common voltage supply line 610.

The valley portion VA, which may be formed by removing a portion of the first organic insulating layer 109 and the second organic insulating layer 111, may be arranged to overlap the first common voltage supply line 610. The valley portion VA may be arranged to continually surround at least a portion of the display area DA and may prevent or reduce the penetration of impurities, such as moisture, etc., from the outside of the substrate 100 into the display area DA through an organic layer.

A second area 2A may be arranged outside the first area 1A. The second area 2A may be defined as an area from an end of the second organic insulating layer 111 to the second boundary 610E2 of the first common voltage supply line 610. That is, the second organic insulating layer 111 may extend from the display area DA to the second area 2A and may not overlap a third area 3A outside the second area 2A.

The second common voltage supply line 620 may be arranged in the first area 1A and the second area 2A. The second common voltage supply line 620 may overlap the first common voltage supply line 610 in the first area 1A, and the first common voltage supply line 610 and the second common voltage supply line 620 may be electrically connected to each other to form the common power supply line 16, e.g., see FIG. 2. The second common voltage supply line 620 may be arranged on the same layer as the contact metal CM, e.g., see FIG. 5. The second common voltage supply line 620 may include the same material as the contact metal CM, e.g., see FIG. 5.

The second common voltage supply line 620 may include the second holes 620*h* two-dimensionally arranged in the first area 1A and the second area 2A. The second hole 620*h* of the second common voltage supply line 620 may be arranged to be apart from the first hole 610*h* of the first common voltage supply line 610 in the first area 1A.

The third area 3A may be arranged outside the second area 2A. The third area 3A may be defined as an area from which a portion of the second organic insulating layer 111 is removed, so that an upper surface of the second common voltage supply line 620 is exposed.

The metal bank layer 320 may be arranged on the first common voltage supply line 610. The metal bank layer 320 may include the first metal layer 321 and the second metal layer 323. The metal bank layer 320 may extend from the display area DA toward the third area 3A. The metal bank layer 320 may have the first bank hole 320*h*1 overlapping the first hole 610*h* of the first common voltage supply line 610 in the first area 1A and the second bank hole 320*h*2 overlapping the second hole 620*h* of the second common voltage supply line 620 in the second area 2A.

The second organic insulating layer 111 may have a third hole 111*h* overlapping the second hole 620*h* of the second common voltage supply line 620 and the second bank hole 320*h*2 of the metal bank layer 320 in the second area 2A. A width (or an area) of the third hole 111*h* of the second organic insulating layer 111 may be less than a width (or an area) of the second hole 620*h* of the second common voltage supply line 620. The second organic insulating layer 111 may cover an edge of the second hole 620*h* of the second common voltage supply line 620. FIG. 13 illustrates that the third hole 111*h* penetrates and extends through the second organic insulating layer 111. However, the second organic insulating layer 111 may have a recess portion or a groove overlapping the second bank hole 320*h*2 of the metal bank layer 320 and the second hole 620*h* of the second common voltage supply line 620 in an embodiment.

A second inorganic pattern 317 may be arranged on the second organic insulating layer 111 to be adjacent to the third hole 111*h* of the second organic insulating layer 111. The second inorganic pattern 317 may have a through-hole overlapping the second hole 620*h* of the second common voltage supply line 650 and the second bank hole 320*h*2 of the metal bank layer 320.

The second inorganic pattern 317 may be arranged on the same layer as the inorganic bank layer 310. The second inorganic pattern 317 may include the same material as the inorganic bank layer 310. For example, the second inorganic pattern 317 may include an inorganic insulating material, such as $SiO_2$, $SiN_x$, and SiON, and may include a single layer or layers including the inorganic insulating materials described above.

The second organic insulating layer 111 may not overlap the third area 3A, and thus, the first metal layer 321 of the metal bank layer 320 and the second common voltage supply line 620 may directly contact each other in the third area 3A.

According to an embodiment, a display apparatus in which a defective rate of pixels is reduced by including a structure for discharging gas generated in an organic layer during a manufacturing process, may be realized. However, the scope of the disclosure is not limited to this effect as described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate including a display area and a non-display area outside the display area;

a pixel electrode on the display area;

a first common voltage supply line on the non-display area and having a first hole; and a metal bank layer on the pixel electrode and the first common voltage supply line and having a pixel opening overlapping the pixel electrode and a first bank hole overlapping the first hole, the pixel opening and the first bank hole extending entirely through the metal bank layer, wherein the first common voltage supply line is spaced apart from the display area in a plan view.

2. The display apparatus of claim 1, wherein the metal bank layer covers an edge of the pixel electrode.

3. The display apparatus of claim 1, further comprising a first inorganic pattern between the metal bank layer and the first common voltage supply line and covering an edge of the first hole.

4. The display apparatus of claim 3, further comprising a sacrificial pattern between the first inorganic pattern and the first common voltage supply line and covering an edge of the first hole.

5. The display apparatus of claim 4, further comprising an inorganic bank layer between the metal bank layer and the pixel electrode and covering an edge of the pixel electrode, wherein the first inorganic pattern includes a same material as the inorganic bank layer.

6. The display apparatus of claim 5, further comprising a residual sacrificial layer between the inorganic bank layer and the pixel electrode, wherein the sacrificial pattern includes a same material as the residual sacrificial layer.

7. The display apparatus of claim 1, wherein a boundary of the first hole is at an outer portion of a boundary of the first bank hole.

8. The display apparatus of claim 7, further comprising a sacrificial pattern between the metal bank layer and the first common voltage supply line and covering an edge of the first hole.

9. The display apparatus of claim 1, wherein a boundary of the first hole corresponds to a boundary of the first bank hole.

10. The display apparatus of claim 1, further comprising a dummy bank overlapping the first hole and apart from the first common voltage supply line, wherein a boundary of the first hole is at an inner portion of a boundary of the first bank hole.

11. The display apparatus of claim 1, further comprising:

an intermediate layer on the pixel electrode through the pixel opening of the metal bank layer; and an opposite electrode on the intermediate layer through the pixel opening of the metal bank layer, wherein the opposite electrode directly contacts a side wall of the metal bank layer having the pixel opening.

12. The display apparatus of claim 1, further comprising a second common voltage supply line below the first common voltage supply line and having a second hole, wherein the second hole is to be apart from the first hole.

13. A display apparatus comprising:

a substrate including a display area and a non-display area outside the display area;

a pixel electrode on the display area;

a first common voltage supply line on the non-display area and having a first hole; and a metal bank layer on the pixel electrode and the first common voltage supply line and having a pixel opening overlapping the pixel electrode and a first bank hole overlapping the first hole, wherein the metal bank layer includes a first metal layer and a second metal layer on the first metal layer, and the second metal layer has a tip extending from an upper surface of the first metal layer toward a center of the pixel opening.

14. A display apparatus comprising:

a substrate including a display area and a non-display area outside the display area;

a pixel electrode on the display area;

a first common voltage supply line on the non-display area and having a first hole;

a second common voltage supply line between the substrate and the first common voltage supply line and having a second hole; and a metal bank layer on the pixel electrode and the first common voltage supply line and having a pixel opening overlapping the pixel electrode, a first bank hole overlapping the first hole, and a second bank hole overlapping the second hole, the pixel opening, the first bank hole, and the second bank hole extending entirely through the metal bank layer.

15. The display apparatus of claim 14, wherein the substrate includes a first area overlapping the first common voltage supply line and a second area outside the first area, and the first bank hole is in the first area, and the second bank hole is in the second area.

16. The display apparatus of claim 15, further comprising an organic insulating layer between the first common voltage supply line and the second common voltage supply line and extending from the display area to the second area.

17. The display apparatus of claim 16, wherein the organic insulating layer covers an edge of the second hole.

18. The display apparatus of claim 16, wherein the organic insulating layer has a third hole overlapping the second hole, and a boundary of the third hole corresponds to a boundary of the second bank hole.

19. The display apparatus of claim 16, further comprising a second inorganic pattern between the metal bank layer and the organic insulating layer and covering an edge of the second hole.

20. The display apparatus of claim 15, wherein the substrate includes a third area outside the second area, and the second common voltage supply line and the metal bank layer directly contact each other in the third area.

* * * * *